United States Patent
Sugeno et al.

(10) Patent No.: US 10,164,298 B2
(45) Date of Patent: Dec. 25, 2018

(54) POWER STORAGE DEVICE, CONTROL METHOD, CONTROL DEVICE, POWER STORAGE SYSTEM, MAINTENANCE SYSTEM, ELECTRIC VEHICLE, AND ELECTRONIC EQUIPMENT

(71) Applicant: Sony Corporation, Tokyo (JP)

(72) Inventors: Naoyuki Sugeno, Fukushima (JP); Yoshihiro Odashima, Tochigi (JP); Kazumi Sato, Ibaraki (JP); Masumi Terauchi, Fukushima (JP); Naruhiko Endo, Fukushima (JP); Toshio Tajima, Fukushima (JP); Koji Umetsu, Miyagi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 175 days.

(21) Appl. No.: 15/301,816

(22) PCT Filed: Mar. 18, 2015

(86) PCT No.: PCT/JP2015/001494
§ 371 (c)(1),
(2) Date: Oct. 4, 2016

(87) PCT Pub. No.: WO2015/155939
PCT Pub. Date: Oct. 15, 2015

(65) Prior Publication Data
US 2017/0117587 A1    Apr. 27, 2017

(30) Foreign Application Priority Data

Apr. 11, 2014    (JP) ................. 2014-081830

(51) Int. Cl.
*H01M 10/48*    (2006.01)
*H01M 10/42*    (2006.01)
(Continued)

(52) U.S. Cl.
CPC ....... *H01M 10/425* (2013.01); *B60L 11/1861* (2013.01); *B60L 11/1864* (2013.01);
(Continued)

(58) Field of Classification Search
CPC .. H01M 10/425; H01M 10/48; B60L 11/1861
See application file for complete search history.

(56) References Cited

U.S. PATENT DOCUMENTS 6,532,425 B1    3/2003 Boost et al.
8,633,826 B2 *  1/2014 Kim .................... H01M 10/443
                                                 320/132

(Continued)

FOREIGN PATENT DOCUMENTS

CN    102754272    10/2012
EP    2538234 A2   12/2012
(Continued)

OTHER PUBLICATIONS

Notice of Reasons for Refusal dated Apr. 3, 2018 in corresponding Japanese Application No. 2014-081830.
(Continued)

*Primary Examiner* — Abdullah Riyami
*Assistant Examiner* — Nader Alhawamdeh
(74) *Attorney, Agent, or Firm* — K&L Gates LLP

(57) ABSTRACT

A storage device includes a storage unit, and an evaluation value acquisition unit wherein the evaluation value acquisition unit is configured to acquire an evaluation value including at least a first evaluation value corresponding to the storage unit in a low-temperature region and a second evaluation value corresponding to the storage unit in a high-temperature region.

16 Claims, 12 Drawing Sheets

(51) Int. Cl.
  *G01R 31/36* (2006.01)
  *B60L 11/18* (2006.01)
  *H01M 10/0525* (2010.01)
  *H02J 7/14* (2006.01)
  *H02J 7/00* (2006.01)

(52) U.S. Cl.
  CPC ..... *G01R 31/3679* (2013.01); *G01R 31/3689* (2013.01); *H01M 10/0525* (2013.01); *H01M 10/48* (2013.01); *H02J 7/0091* (2013.01); *H02J 7/1453* (2013.01); *H01M 2010/4271* (2013.01); *H01M 2010/4278* (2013.01); *H01M 2220/20* (2013.01); *H01M 2220/30* (2013.01); *H02J 7/0014* (2013.01); *Y02T 10/7011* (2013.01); *Y02T 10/7055* (2013.01)

(56) References Cited

U.S. PATENT DOCUMENTS

| | | | | |
|---|---|---|---|---|
| 9,627,720 | B2* | 4/2017 | Yun | H01M 10/486 |
| 2010/0026244 | A1* | 2/2010 | Iida | B66B 5/027 |
| | | | | 320/134 |
| 2011/0210859 | A1 | 9/2011 | Kim | |
| 2013/0200845 | A1* | 8/2013 | Bito | H02J 7/0042 |
| | | | | 320/109 |
| 2014/0351950 | A1* | 11/2014 | Sakemi | G06F 21/78 |
| | | | | 726/26 |
| 2014/0379188 | A1* | 12/2014 | Uesaka | H01M 10/44 |
| | | | | 701/22 |
| 2016/0054017 | A1* | 2/2016 | Takahashi | F24F 11/006 |
| | | | | 700/276 |
| 2017/0117587 | A1* | 4/2017 | Sugeno | G01R 31/3679 |
| 2017/0366023 | A1* | 12/2017 | Tanaka | H02J 3/32 |
| 2018/0006508 | A1* | 1/2018 | Ueki | H04B 7/10 |

FOREIGN PATENT DOCUMENTS

| | | |
|---|---|---|
| JP | H09293539 | 11/1997 |
| JP | 2003-161768 A | 6/2003 |
| JP | 2010066160 | 3/2010 |
| JP | 2011064627 | 3/2011 |
| JP | 2013-516947 A | 5/2013 |
| JP | 2013168285 | 8/2013 |
| WO | 2011/135609 | 3/2011 |

OTHER PUBLICATIONS

International Search Report dated Jun. 12, 2015 in international application No. PCT/JP2015/001494 (3 pages).

Written Opinion dated Jun. 12, 2015 in international application No. PCT/JP2015/001494 (8 pages).

Office Action for Japanese counterpart application No. 2014-081830; dated Feb. 20, 2018; (4 pages).

Chinese Office Action dated Sep. 14, 2018 in corresponding Chinese Application No. 201580017428.

Notice of Reasons for Refusal dated Aug. 7, 2018 in corresponding Japanese Application No. 2014-081830.

* cited by examiner

POWER STORAGE DEVICE, CONTROL METHOD, CONTROL DEVICE, POWER STORAGE SYSTEM, MAINTENANCE SYSTEM, ELECTRIC VEHICLE, AND ELECTRONIC EQUIPMENT

CROSS-REFERENCE TO RELATED APPLICATIONS

The present application claims the benefit of International Application No. PCT/JP2015/001494, filed Mar. 18, 2015, which claims priority to Japanese Application No. 2014-081830, filed Apr. 11, 2014, the disclosures of which are incorporated herein by reference.

TECHNICAL FIELD

The present disclosure relates to a power storage device, a control method, a control device, a maintenance system, a maintenance device, an electric vehicle, and an electronic equipment.

BACKGROUND ART

In recent years, the application of secondary batteries such as lithium ion secondary batteries have rapidly expanded and the batteries have come to be applied to, for example, storage batteries for automobiles or power storage devices for electric power accumulation combined with the new energy system such as solar batteries or wind power generation. For generating high output, a battery system to which one or a plurality of power storage devices is connected is used. The power storage device is formed by, for example, housing one or a plurality of battery blocks in an exterior case. The battery block is formed by connecting a plurality of unit cells (also referred to as a single battery or a cell, and hereinafter called battery cell simply), which corresponds to an example of a power storage element.

As a method of managing such secondary batteries, PTL 1 below discloses the technology of managing a battery pack including a secondary battery by measuring the time of charging and discharging with the large current under high temperature.

CITATION LIST

Patent Literature

PTL 1: JP 2013-516947 T

SUMMARY

Technical Problem

The method of managing the secondary battery disclosed in PTL 1 has been insufficient.

In view of the above, it is desirable to provide a power storage device, a control method, a control device, a power storage system, a maintenance system, an electric vehicle, and an electronic equipment, which can appropriately manage a device in which one or a plurality of secondary batteries is used.

In the power storage module in which a plurality of lithium ion secondary batteries is used, it is necessary to consider the temperature increase at the charging and discharging of the batteries and the deterioration in performance of the battery due to the decrease (especially in the state of 0degC. or less) in external environment temperature to perform charging and discharging. For example, during the discharging, the temperature rise near the center of the inside of the power storage module is larger than the temperature rise around the power storage module. Moreover, in the charging especially in the cold area, the temperature near the power storage unit is low (especially being in the state of 0degC. or less); therefore, in the normal charging condition, the state in which the sufficient charging capacity cannot be taken into the battery continues and in some cases lithium is separated out on the surface of the negative electrode to thereby deteriorate the performance of the battery. Therefore, it is necessary to control the charging and/or discharging of the power storage module according to the temperature change of the power storage module or the external environment.

Solution to Problem

According to an aspect of the present technology, there is provided a storage device including a storage unit and an evaluation value acquisition unit, wherein the evaluation value acquisition unit is configured to acquire an evaluation value including at least a first evaluation value corresponding to the unit in a low-temperature region and a second evaluation value corresponding to the storage unit in a high-temperature region.

Another aspect of the present technology is a control method including, for example, acquiring an evaluation value in regard to the use of a storage unit by an evaluation value acquisition unit and acquiring at least an evaluation value in a low-temperature region and an evaluation value in a high-temperature region among a plurality of regions set based on temperature by the evaluation value acquisition unit.

Another aspect of the present technology is a control device including, for example, a communication unit configured to communicate with a storage unit; and a control unit, wherein the control unit is configured to control a condition of the storage unit by comparing a value based on at least a first evaluation value in a low-temperature region and a second evaluation value in a high-temperature with a predetermined threshold.

Another aspect of the present technology is a power storage system including, for example, a plurality of storage devices and a control device connected to the plurality of storage devices, wherein: the storage device includes a storage unit and an evaluation value acquisition unit, wherein the evaluation value acquisition unit is configured to acquire an evaluation value including at least a first evaluation value corresponding to the storage unit in a low-temperature region and a second evaluation value corresponding to the storage unit in a high-temperature region; the control device including a communication unit configured to communicate with the storage device and through which a value based on the evaluation value is provided.

Another aspect of the present technology is a maintenance system including, for example, a first device and a second device, wherein the first device includes a first communication unit configured to communicate with the storage device, a second communication unit configured to communicate with the second device, an evaluation value acquisition unit configured to acquire an evaluation value, and a control unit is configured to, when the evaluation value is greater than a predetermined threshold, control for transmitting a predetermined signal to the second device using the second communication unit, wherein the evaluation value including at least a first evaluation value corresponding to the storage device in a low-temperature region and a second evaluation value corresponding to the storage device in a high-temperature region, and the second device includes a reception unit configured to receive the predetermined signal transmitted from the first device.

Another aspect of the present technology is an electric vehicle including, for example, a storage unit according to an embodiment of the present disclosure includes the above-described storage device.

Another aspect of the present technology is an electronic equipment including, for example, a storage device according to an embodiment of the present disclosure includes the above-described storage device.

Advantageous Effects of Invention

According to at least one embodiment, the device in which the secondary battery is used can be managed as appropriate. The effect described herein is not necessarily limited and any of the effects described in this specification may be achieved. The described effects do not limit the content of the present technology.

DESCRIPTION OF EMBODIMENTS

Figure 1:
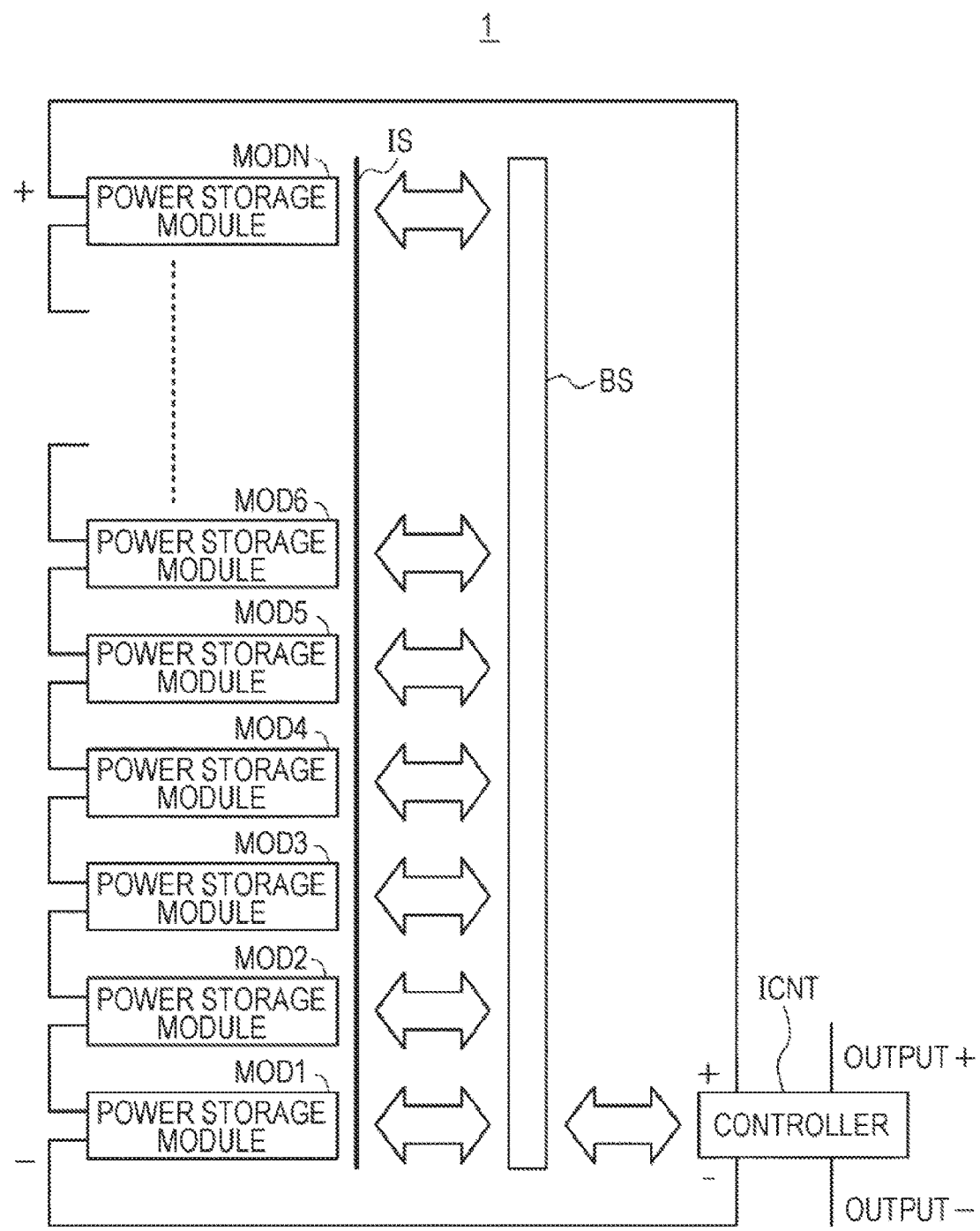
FIG. 1 is a diagram illustrating an example of a structure of a power storage system.

A plurality of embodiments of the present technology is hereinafter described with reference to the drawings. The description is made in the following order:
<1. First Embodiment>
<2. Second Embodiment>
<3. Third Embodiment>
<4. Application example>
<5. Modified example>

The embodiments and the like described below are preferable specific examples of the present technology and the content of the present technology is not limited to the embodiments and the like. In the description below, "less than A" may be interpreted as less than or equal to A, and "more than A" may be interpreted as more than (not including A) or equal to A. This similarly applies to other terms such as "low" and "high".

1. First Embodiment (Summary of Power Storage Module)

In the case of using a number of power storage elements, for example battery cells, for generating high output, for example, such a structure is employed that a plurality of power storage units is connected and a common control device is provided for the plurality of power storage units. In the description below, the power storage unit is referred to as a power storage module as appropriate. A system including one or a plurality of power storage modules and a control device provided as a structure common among the modules is referred to as a power storage system as appropriate. The power storage system may be referred to as a string.

A power storage module as an example of the power storage device is the unit obtained by combining a battery block and a module controller. The battery block is also referred to as a sub-module. The battery block is constructed by, for example, connecting eight cylindrical lithium ion secondary batteries in parallel. The power storage module is housed in an exterior case and within the exterior case of the power storage module, for example, 16 battery blocks are connected in series. Note that the number of battery blocks and the connection state can be changed as appropriate.

The power storage module includes an exterior case. The exterior case is desirably formed of a material with high thermal conductivity and high radiation rate. The use of the material with the high conductivity and high radiation rate enables the exterior case to have the excellent heat release property. With the excellent heat release property, the temperature increase in the exterior case can be suppressed. Moreover, the opening portion of the exterior case can be minimized or omitted, whereby the high dust-proof and water-proof properties can be achieved. For the exterior case, for example, aluminum, aluminum alloy, copper, copper alloy, or the like can be used.

In the embodiment of the present technology, a lithium ion secondary battery is used as an example of the secondary battery. The lithium ion secondary battery is, for example, the secondary battery including a positive electrode active material, and a carbon material such as graphite as a negative electrode active material. The positive electrode material is not particularly limited; preferably, a positive electrode active material having an olivine structure is contained. In the embodiment of the present technology, the lithium ion secondary battery is described as the example of the secondary battery; however, other secondary batteries than the lithium ion secondary battery can be applied to the embodiment of the present technology.

In regard to the characteristics of the lithium ion secondary battery, it has been known that the use of the lithium ion secondary battery under low temperature or high temperature deteriorates the performance. For example, when the lithium ion secondary battery is charged under a temperature of less than 0 degC., lithium ions from the positive electrode is absorbed in the negative electrode less easily and lithium metal is separated out on the surface of the negative electrode, whereby the electrode resistance is increased. When the separated lithium metal is deposited as a layer, the absorption of lithium ions is further interrupted. The interruption of the reaction in the electrode decreases the efficiency of the charging and discharging, resulting in the lower performance (capacitance, cycle lifetime, or the like) of the lithium ion secondary battery. For these reasons, under the low temperature, the charging is prohibited or the charging current is controlled to be small.

When the lithium ion secondary battery is used under high temperature, the performance thereof may be deteriorated. For example, when lithium ion secondary battery is used at 45 degC. or more, the performance of the lithium ion secondary battery may be deteriorated.

Note that the temperature can be measured by, for example, a temperature detector such as a thermistor provided for the power storage module. Alternatively, the temperature information may be acquired through the network from, for example, an external device providing weather information.

In view of the above points, when the lithium ion secondary battery is used as the secondary battery, it is desirable to know not just the charging and discharging time by large current under the high temperature but also the use circumstances of the power storage module in at least a low-temperature region and a high-temperature region among the regions based on temperature.

(Summary of Power Storage System)

An example of the power storage system is schematically described. FIG. 1 illustrates an example of the power storage system. In a power storage system 1 denoted by a reference symbol 1, N number of power storage modules MOD1 to MODN are connected in series. When it is not necessary to distinguish the power storage modules, the power storage module is referred to as MOD. The number of power storage modules to be connected and the connection state thereof can be changed as appropriate. The power storage modules MOD1 to MODN are connected to an interface bus BS through an insulating portion IS.

Each of the power storage modules MODs is provided with an insulating interface for connecting between the module controller and the interface bus BS. This insulating interface serves to insulate between the power storage module MOD and the interface bus BS. Each module controller is connected to the entire control device (hereinafter referred to as controller as appropriate) ICNT, and the controller ICNT performs management for the charging, discharging, deterioration suppression, or the like.

As the bus in the power storage module MOD and the interface bus BS that connects between the power storage modules MOD1 to MODN and the controller ICNT, the serial interface is used. As the serial interface, specifically, a System Management Bus (SM bus) or the like is used. For example, I2C bus can be used. I2C bus is for the synchronous serial communication performing the communication through two signal lines of bidirectional SDA (serial data) and SCL (serial clock).

The module controller of each power storage module MOD and the controller ICNT perform the communication. For example, the controller ICNT receives the information on the internal state of each power storage module MOD, so that the charging process and the discharging process of each power storage module MOD are managed. The controller ICNT supplies the output of the serial connection of the N number of power storage modules MODs to the load. The power storage modules MODs are mutually connectable. The output voltage of one power storage module MOD is, for example, 51.2 V and when N=1 to 16, the output voltage of approximately 50 V to approximately 800 V is generated.

Figure 2:
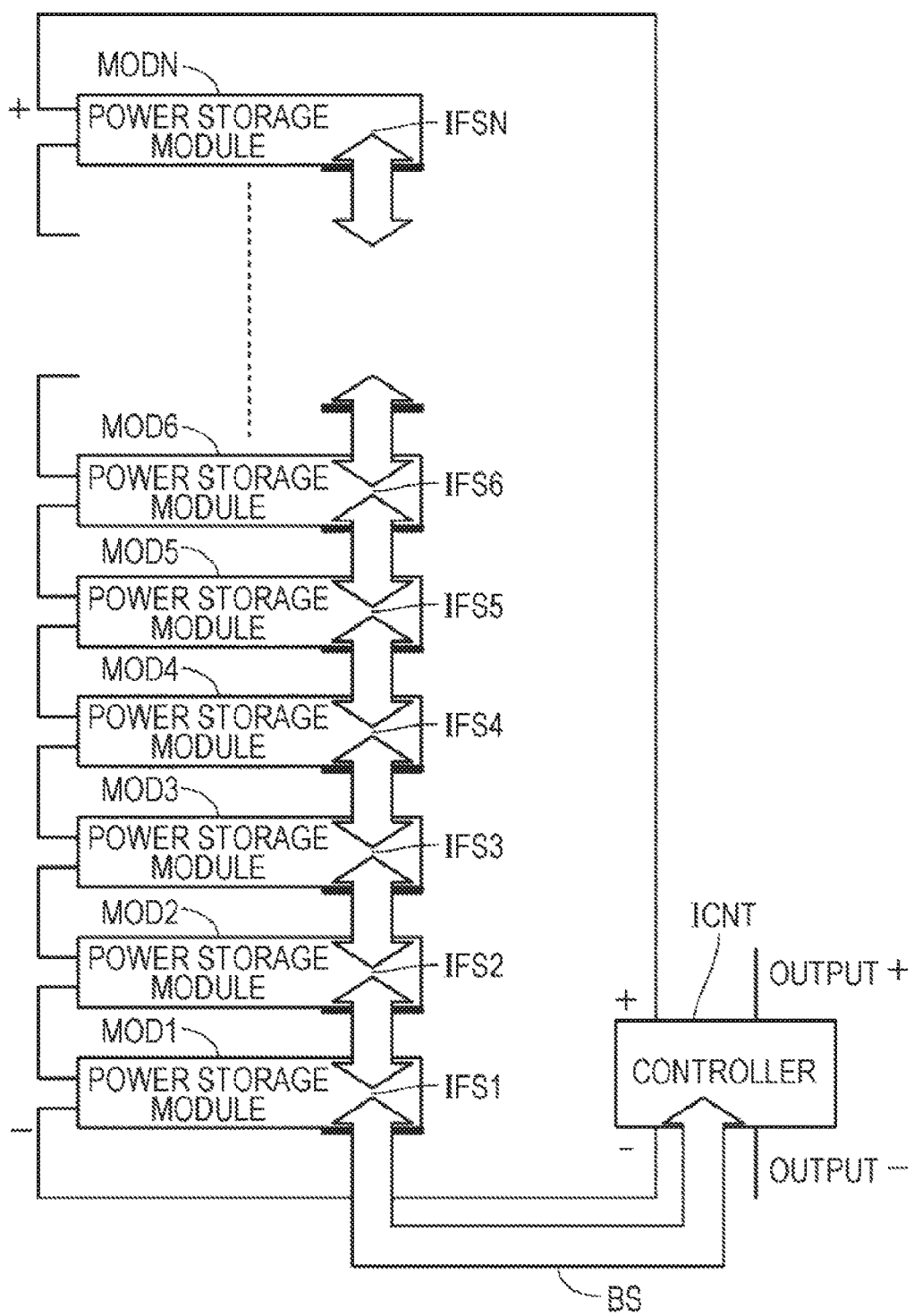
FIG. 2 is a diagram illustrating another example of the structure of the power storage system.

FIG. 2 illustrates another example of the power storage system. In a power storage system denoted by a reference symbol 2, N number of power storage modules MOD1 to MODN are connected in series. Each of the power storage modules MOD1 to MODN has an insulating interface for insulating between the power storage modules MODs. Through photo-couplers IFS1 to IFSN as an example of the insulating interface, the module controller of each power storage module MOD communicates with the upper or lower power storage module MOD or with the external controller ICNT.

The controller ICNT is connected to the lowest power storage module MOD1. The controller ICNT controls the entire power storage system. For example, the information on the internal state of each power storage module MOD is received by the controller ICNT and by supplying or blocking the charging current and the discharging current to each power storage module MOD, the charging and discharging of each power storage module MOD are controlled. A control signal from the controller ICNT is transmitted to the upper power storage module MOD through, for example, the lower power storage module MOD.

(Structure of Power Storage Module)

An example of the structure of the power storage module MOD is described with reference to FIG. 3. Note that although the structure of the power storage module MOD1 is used as an example, this structure similarly applies to the other power storage modules MODs.

Figure 3:
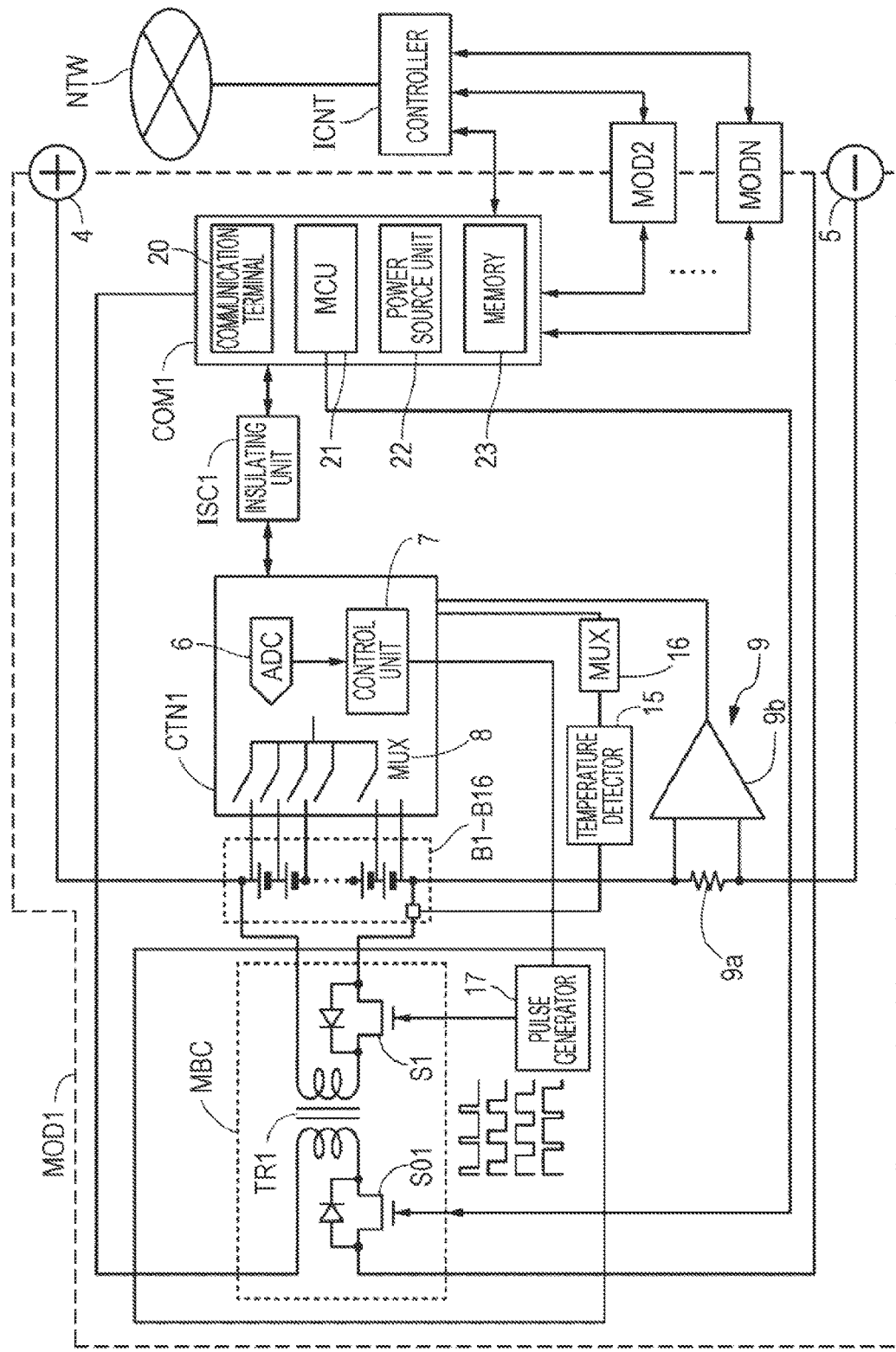
FIG. 3 is a diagram illustrating an example of a structure of a power storage module.

As illustrated in FIG. 3, the power storage module MOD1 includes, for example, a positive electrode terminal 4, a negative electrode terminal 5, a power storage unit, a module controller CTN1, an insulating unit ISC1, a communication unit COM1, a current detector 9, a temperature detector 15, a multiplexer (MUX) 16, a pulse generator 17, and a module balance control circuit MBC.

The power storage unit includes, for example, 16 battery blocks (battery blocks B1 to B16) connected in series. Each battery block is constructed by connecting eight cylindrical lithium ion secondary batteries in parallel; however, the present technology is not limited thereto. Each of the battery blocks B1 to B16 is connected to the module controller CTN1, and charging and discharging are controlled by the module controller CTN1. The charging and discharging are performed through the positive electrode terminal 4 and the negative electrode terminal 5. For example, one power storage module outputs about 51.2 V (16*3.2 V).

The module controller CTN1 includes, for example, an ADC (Analog to Digital Converter) 6, a control unit 7, and a multiplexer 8. The module controller CTN1 detects the voltage at opposite ends of the 16 battery blocks B1 to B16 connected in series and the voltage of each battery block.

The multiplexer 8 sequentially outputs the voltage at opposite ends of the battery blocks B1 to B16 and the voltage of each battery block. The multiplexer 8 switches the channels in response to control signals from the control unit 7 to select one piece of analog voltage data from among n number of pieces of analog voltage data. The one piece of analog voltage data selected by the multiplexer 8 is supplied to the ADC 6.

The ADC 6 converts the analog data input to the module controller CTN1 into digital data, and outputs the digital data to the control unit 7. For example, the ADC 6 converts the analog voltage data supplied from the multiplexer 8 into digital voltage data. For example, the analog voltage data are converted into digital voltage data of 14 to 18 bits. The digital data generated by the ADC 6 are output to the communication unit COM1 through the insulating unit ISC1 by the control of the control unit 7. For example, 16 pieces of digital voltage data are time-divisionally multiplexed and output to the communication unit COM1.

The control unit 7 includes, for example, a Central Processing Unit (CPU). The control unit 7 may include a plurality of CPUs. The control unit 7 manages the charging and discharging of the power storage unit. For example, upon the detection of the flow of excessive current at the discharging, the control unit 7 determines the state as the over-current discharging state and controls the switch (not shown) to an open state (state of blocking the current). On the other hand, upon the detection of excessive current in the charging or overcharging, the control unit 7 controls the switch (not shown) to an open state (state of blocking the current). The switch controlled to be on or off by the control unit 7 is connected to a power line between the module controller CTN1 and the positive electrode terminal 4 or a power line between the module controller CTN1 and the negative electrode terminal 5.

The control unit 7 sets the charging current and the discharging current to the power storage unit. For example, the control unit 7 sets the charging current and the discharging current in the regions set based on the temperature to appropriate values.

The insulating unit ISC1 has a function of insulating between the communication unit COM1 and the module controller CTN1. In other words, the reference potential of the power source of the communication unit COM1 and the reference potential of the power source of the module controller CTN1 are separated and made independent. Moreover, in the insulated state, the insulating unit ISC1 has the function of supplying the power source voltage to the module controller CTN1 and the function as a transmission medium of the bidirectional communication.

In the bidirectional communication performed through the insulating unit ISC1, for example, Controller Area Network (CAN) specification can be used. As the power transmission performed through the insulting unit ISC1, an electromagnetic induction type, a magnetic resonance type, a radio wave reception type, or the like can be used.

In the embodiment of the present technology, for example, a noncontact IC card technology is used. In the noncontact IC card technology, communication and power transmission are performed between a reader/writer and a card by the magnetic coupling between an antenna coil of the reader/writer and an antenna coil of the card. The communication is performed at a speed of 212 or 424 kbps by using a method in which the carrier wave with a frequency of 13.56 kHz is modulated by Amplitude Shift Keying (ASK). The insulating unit ISC1 has the specification similar to the noncontact IC card. Moreover, for example, the insulating unit ISC1 performs the communication and the power transmission between the antennas (coils) formed in the different layers of the multilayer printed board.

The communication unit COM1 includes, for example, a communication terminal 20, a Micro Controller Unit MCU 21, a power source unit 22, and a memory 23. The communication unit COM1 performs the communication with an external device to be connected through the communication terminal 20. For example, through the communication terminal 20, communication between the power storage module MOD1 and the controller ICNT or the other power storage modules MODs is performed. Moreover, the control signal from the controller ICNT is input to the power storage module MOD1 through the communication terminal 20. The communication through the communication unit COM1 may be either wired or wireless. Thus, the communication unit COM1 performs the bidirectional communication.

The data supplied from the module controller CTN1 are input to the communication unit COM1 through the insulating unit ISC1. The data supplied from the module controller CTN1 include the digitized voltage data for each battery block, the digitized temperature data, the digitized current data, and the data acquired by the control of the control unit 7, or the like. The data input to the communication unit COM1 are output to, for example, the controller ICNT.

The MCU 21 controls the communication between the power storage module MOD1 and the controller ICNT. The MCU 21 may perform other controls than the control over the communication. The power source unit 22 supplies the power source voltage for operating, for example, the communication unit COM1. The power source unit 22 may be chargeable by the power from the power storage unit.

The memory 23 includes, for example, a Read Only Memory (ROM) and a Random Access Memory (RAM). The ROM stores programs to be executed by the MCU 21 or the control unit 7. The RAM is used as the work memory of the MCU 21. The data supplied from the module controller CTN1, the data obtained by the control of the MCU 21, and the data supplied from the controller ICNT are stored in the RAM temporarily. The RAM stores the use history (log) of the power storage module MOD1. For example, the RAM stores the charging time at a certain temperature, the discharging time at a certain temperature, and the time obtained by integrating these times.

The current detector 9 detects the value of current flowing through the battery blocks B1 to B16. The current detector 9 includes, for example, a current detection resistor 9a and a current detection amplifier 9b. The current detection resistor 9a detects the analog current data representing the voltage value at the opposite ends of the current detection resistor 9a. The analog current data are constantly detected either during the charging or the discharging, for example. The analog current data may be detected at a predetermined cycle.

The detected analog current data are supplied to the current detection amplifier 9b. The current detection amplifier 9b amplifies the analog current data at a predetermined amplification ratio. The amplified analog current data are supplied to the ADC 6 of the module controller CTN1. With the ADC 6, the analog current data are converted into the digital current data. The digital current data are output from the module controller CNT1 to the communication unit COM1.

The temperature detector 15 includes a temperature detection element such as a thermistor. The temperature detector 15 includes one or a plurality of temperature detection elements. In this embodiment of the present technology, the temperature detection element is provided for each battery block so that the temperature of each battery block can be detected.

The analog temperature data T representing the temperature of each of the battery blocks B1 to B16 detected by the temperature detector 15 are supplied to a multiplexer 16. For example, the analog temperature data T1 representing the temperature of the battery block B1 are supplied to the multiplexer 16. The analog temperature data T2 representing the temperature of the battery block B2 are supplied to the multiplexer 16. Similarly, the analog temperature data T3 to the analog temperature data T16 respectively representing the temperatures of the battery block B3 to the battery block B16 are supplied to the multiplexer 16.

The multiplexer 16 selects one piece of analog temperature data T from among 16 pieces of analog temperature data T1 to T16 by switching the channel in response to a predetermined control signal. The one piece of analog temperature data T selected by the multiplexer 16 is supplied to the ADC 6 of the module controller CTN1. The analog temperature data T are converted into the digital temperature data T by the ADC 6, and the converted digital temperature data T are output, for example, from the module controller CTN1 to the communication unit COM1.

By having the module balance control circuit MBC, the power storage module MOD of the embodiment of the present technology can perform the control for homogenizing the voltages of the battery blocks B1 to B16, i.e., the cell balance control. The module balance control circuit MBC includes, for example, a flyback transformer TR1, a switch S1 on the primary side of the flyback transformer TR1, and a switch S01 on the secondary side of the flyback transformer TR1. The switches S1 and S01 are formed of, for example, Metal Oxide Semiconductor Field Effect Transistor (MOSFET), and each have a structure including a parasitic diode.

The cell balance control is executed by, for example, the control unit 7. The cell balance control is described schematically. For example, when the discharge voltage of one of the plurality of battery blocks B1 to B16 reaches to the lower limit, the other battery blocks still have a capacity left. In the next charging, the other battery blocks having the capacity left reaches the charge upper-limit voltage sooner and therefore the fully-charged state cannot be obtained. For avoiding such unbalance, the Metal Oxide Semiconductor Field Effect Transistor (MOSFET) is turned on so that the battery block having the capacity left is forcibly discharged. Note that the type of the cell balance control is not limited to the passive type as described above and may be so-called active type or other various types.

The pulse generator 17 generates control pulses in response to control signals from the control unit 7. The pulse generator 17 outputs the control pulses whose pulse width is modulated. The control pulses for the switch S1 is supplied from the pulse generator 17 to control the on/off of the switch S1. The control pulse for the switch S01 on the secondary side of the flyback transformer TR1 is supplied from the MCU 21 in the communication unit COM1 to control the on/off of the switch S01.

An example of the structure of the power storage module has been described. The power storage module is not limited to the described example but may have another structure added or the structure eliminated as appropriate.

(Structure of Controller)

Next, an example of the structure of the controller (controller ICNT) provided in accordance with one or a plurality of power storage modules is described. As illustrated in FIG. 3, for example, the controller ICNT is capable of communication with a plurality of power storage modules MODs and communication with a device connected to the network NTW through the network NTW. The network NTW is, for example, the Internet. The device connected to the network NTW is, for example, a maintenance device for maintaining the power storage system.

Figure 4:
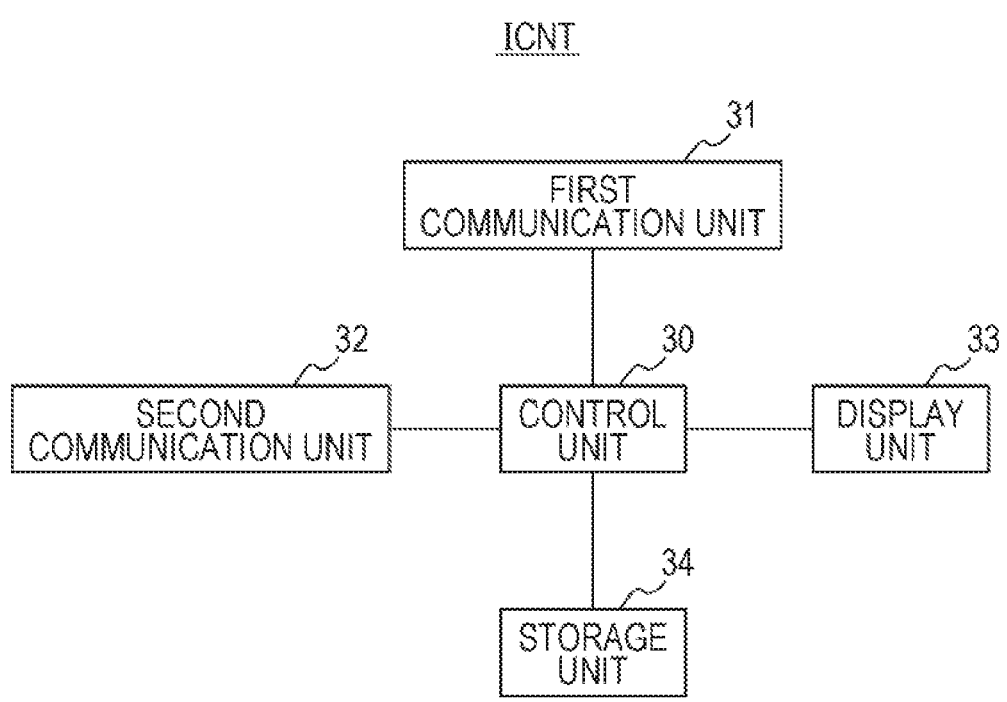
FIG. 4 is a diagram illustrating an example of a structure of a controller.

FIG. 4 illustrates an example of the structure of the controller ICNT. The controller ICNT includes, for example, a control unit 30, a first communication unit 31, a second communication unit 32, a display unit 33 and a storage unit 34. Note that the first communication unit 31 and the second communication unit 32 are abbreviated as the communication unit 31 and the communication unit 32, respectively.

The control unit 30 includes, for example, a CPU, and controls each unit of the controller ICNT. The communication unit 31 is to communicate with each power storage module MOD. The communication unit 32 is to communicate with the device connected to the network NTW based on a predetermined communication method.

The display unit 33 includes a driver and a display panel. The display unit 33 displays, for example, the operation status of the power storage system. The display in regard to the operation status of the power storage system includes the display notifying that the power storage system is in normal operation, the warning notifying that the abnormality occurs in the power storage system, the display suggesting the maintenance, the display notifying that a predetermined power storage system is forcibly stopped for safety, or the like. Note that the user may be notified of the operation status of the power storage system by the lighting of a Light Emitting Diode (LED) or sound or using these with the display.

The storage unit 34 includes, for example, a ROM and a RAM. The ROM stores programs to be executed by the control unit 30. The RAM is used as the work memory when the control unit 30 executes the process. The RAM stores the data supplied from the power storage module MOD or the data supplied through the network NTW temporarily.

(Operation of Power Storage System)

Next, an example of the operation of the power storage system is described. Although the description below is made of the operation in regard to the embodiment of the present technology, the operation of the power storage system is not limited to the described one but may be the well-known operation.

Figure 5:
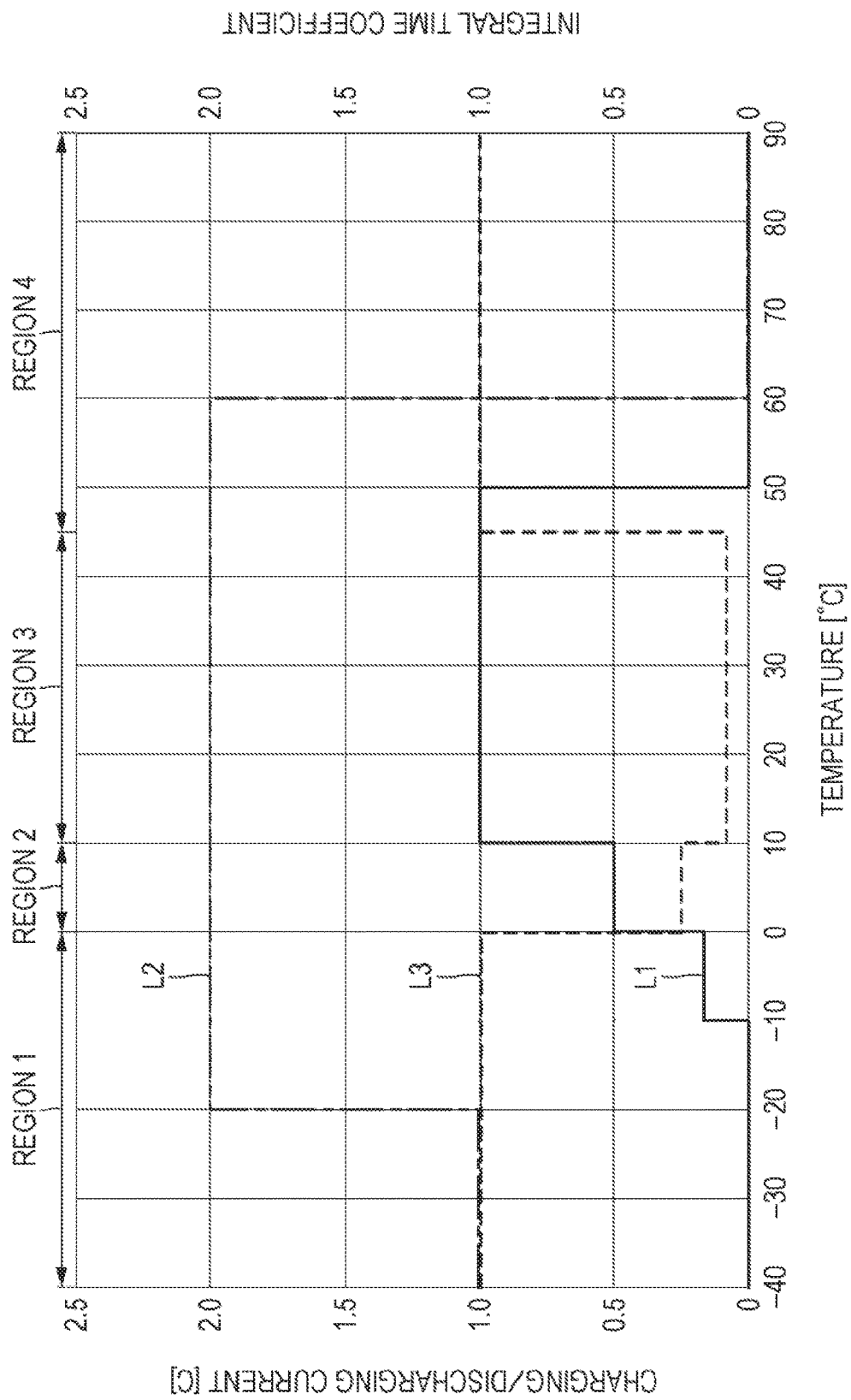
FIG. 5 is a diagram illustrating an example of the charging current, discharging current, and integral time coefficient depending on temperature.

First, an example of the operation of the power storage module MOD is described with reference to FIG. 5. In FIG. 5, the horizontal axis represents the temperature (degC.) and the vertical axis represents the charging/discharging current or the integral time coefficient corresponding to an example of the weighting factor. Here, C is used as the unit of the magnitude of the charging/discharging current. For example, 1 C is the value of current at which the theoretical capacity is fully discharged (or charged) in an hour.

In FIG. 5, the graph L1 of the solid line represents the magnitude of the charging current. The magnitude of the charging current is set by the control unit 7 of the module controller CTN1 in response to the control by the controller ICNT. For example, when the temperature is lower than −10 degC., the charging of the power storage module MOD is prohibited (charging prohibited). When the charging is performed in the temperature range of −10 degC. to 0 degC., the charging current is set to, for example, 0.2 C (charging current limited). When the charging is performed in the temperature range of 0 degC. to 10 degC., the charging current is set to, for example, 0.5 C (charging current limited). When the charging is performed in the temperature range of 10 degC. to 50 degC., the charging current is set to, for example, 1.0 C (normal charging and discharging). When the temperature is higher than 50 degC., the charging is prohibited (charging prohibited).

In FIG. 5, the graph L2 of the alternate long and short dash line represents the magnitude of the discharging current. The magnitude of the discharging current is set by the control unit 7 of the module controller CTN1 in response to the control by the controller ICNT. For example, when the temperature is lower than −20 degC., the discharging of the power storage module MOD is set to 1.0 C. When the discharging is performed in the temperature range of −20 degC. to 60 degC., the discharging current is set to, for example, 2.0 C. When the temperature is higher than 60 degC., the discharging is prohibited.

The control unit 7 serves as the evaluation value acquisition unit that acquires the evaluation value based on the use circumstances (operation status) of the power storage unit of the power storage module MOD. The control unit 7 acquires at least the evaluation value in the high-temperature region and the evaluation value in the low-temperature region among the plurality of regions set based on temperature. The high temperature region and the low-temperature region are the regions where the performance of the power storage unit may deteriorate when the power storage module MOD is used in those regions.

In the embodiment of the present technology, for example, regions as below are set.

Region 1: temperature measured by the temperature detector 15 is lower than 0 degC.

Region 2: temperature measured by the temperature detector 15 is higher than 0 degC. and lower than 10 degC.

Region 3: temperature measured by the temperature detector 15 is higher than 10 degC. and lower than 45 degC.

Region 4: temperature measured by the temperature detector 15 is higher than 45 degC.

At least one of Region 1 and Region 2 corresponds to an example of the low-temperature region and Region 4 corresponds to an example of the high-temperature region. The control unit 7 acquires the evaluation value by using the integral time coefficient as an example of the weighting factor. The integral time coefficient is set for each target region from which the evaluation value is acquired, for example.

As indicated by the dotted line L3 in FIG. 5, the integral time coefficient of Region 1 is 1.0, the integral time coefficient of Region 2 is 0.3, the integral time coefficient of Region 3 is 0.1, and the integral time coefficient of Region 4 is 1.0. Since the performance of the lithium ion secondary battery may deteriorate by the use under low temperature or high temperature, the integral time coefficient is set to be larger as the temperature becomes lower or higher in the embodiment of the present technology.

In the first embodiment, the control unit 7 acquires each of the evaluation values of Region 1, Region 2, and Region 4.

The evaluation value in Region 1 is obtained by Formula (1) below, for example.

(Integral time obtained by integrating the time for which the power storage unit is charged in the temperature range of lower than 0degC.)*integral time coefficient (1.0)  (1)

The evaluation value in Region 2 is obtained by Formula (2) below, for example.

(Integral time obtained by integrating the time for which the power storage unit is charged in the temperature range of higher than 0degC. and lower than 10degC.)*integral time coefficient (0.3)  (2)

The evaluation value in Region 4 is obtained by Formula (3) below, for example.

(Integral time obtained by integrating the time for which the power storage module MOD is used in the temperature range of higher than 45degC.)*integral time coefficient (1.0)  (3)

Note that the time for which the power storage module MOD is used in Formula (3) includes, for example, the time for which the power storage module MOD is charged, the time for which the power storage module MOD is discharged, and the time for which the power storage module MOD is left without being charged or discharged. In other words, the time corresponds to the time for which the power storage module MOD is exposed to the environment at a temperature of higher than 45 degC. This similarly applies to Formula (6) and Formula (7) to be described below. The integral time in each formula can be obtained by referring to the use history of the power storage module MOD1 stored in the memory 23.

The control unit 7 acquires the temperature based on the temperature information supplied from the temperature detector 15, accumulates the charging time, or the like at each temperature and stores the results in the memory 23. The evaluation value in each region is obtained using Formulae (1) to (3) at an appropriate timing and the value based on the evaluation value is calculated.

The value based on the evaluation value may be an individual evaluation value and may be the value obtained by performing a predetermined calculation on each evaluation value. In this example, the value obtaining by totaling the evaluation value from Formula (1), the evaluation value from Formula (2), and the evaluation value from Formula (3) (hereinafter referred to as the total evaluation value as appropriate) corresponds to the value based on the evaluation value. The total evaluation value is stored in the memory 23 as the accumulative time information representing the deterioration degree of the power storage module MOD. In the case where the total evaluation value is acquired newly, the total evaluation value is updated and the updated total evaluation value is stored in the memory 23.

The control unit 7 executes the control in response to the total evaluation value. For example, the control unit 7 outputs the total evaluation value to the communication unit COM1 in response to the request from the controller ICNT. By the control from the MCU 21 in the communication unit COM1, the total evaluation value is transmitted from the communication unit COM1 to the controller ICNT. Note that the total evaluation value may be correlated with the identifier (Identifier (ID)) for identifying the power storage module MOD.

Next, an example of the operation of the controller ICNT is described. In the description below, the operation in regard to the embodiment of the present technology is described; however, the operation of the controller ICNT is not limited to the described one but may be the well-known one.

The controller ICNT receives in the communication unit 31, the data representing the total evaluation value transmitted from the power storage module MOD. The data representing the total evaluation value are supplied from the communication unit 31 to the control unit 30. The control unit 30 appropriately acquires the total evaluation value by, for example, demodulating the data representing the total evaluation value.

The control unit 30 compares the total evaluation value with a threshold. As the threshold, for example, three thresholds are set. As the three thresholds, for example, 7000 hours, 9000 hours, and 10000 hours are set.

The control unit 30 outputs the signal for warning (hereinafter referred to as a warning signal as appropriate) to the display unit 33 when the total evaluation value exceeds 7000 hours. In response to the warning signal, the display unit 33 displays the warning. Note that when the total evaluation value is less than 7000 hours, it is determined that the power storage system is normal (the deterioration is not progressed to the level).

When the total evaluation value exceeds 9000 hours, the control unit 30 outputs the signal for notifying beforehand the stop of the power storage system (hereinafter referred to as a stop notification signal as appropriate) on the display unit 33. In response to the stop notification signal, the display unit 33 displays the information notifying that the power storage system stops in the near future.

When the total evaluation value exceeds 9000 hours, the control unit 30 outputs a predetermined signal. The predetermined signal corresponds to, for example, a signal indicating that the power storage system needs to be maintained (the signal is referred to as a maintenance inspection calling signal as appropriate). The maintenance inspection calling signal output from the control unit 30 is transmitted to the network NTW through the communication unit 32. Then, the maintenance inspection calling signal is transmitted to the maintenance device connected to the network NTW.

Note that the ID for identifying the power storage module MOD may be added to the predetermined signal. This enables the power storage module MOD, which is identified by the ID, to be thoroughly inspected in the maintenance of the power storage system. Note that the example of the maintenance system will be specifically described in the application example below.

When the total evaluation value exceeds 10000 hours, the control unit 30 outputs the signal for stopping the operation of the power storage system (hereinafter referred to as a stop signal as appropriate). In response to the stop signal, the power storage system stops to operate and the charging or discharging by the power storage system is prohibited. The display unit 33 of the controller ICNT may display the information representing that the operation of the power storage system is stopped forcibly.

(Flow of Process)

Figure 6:
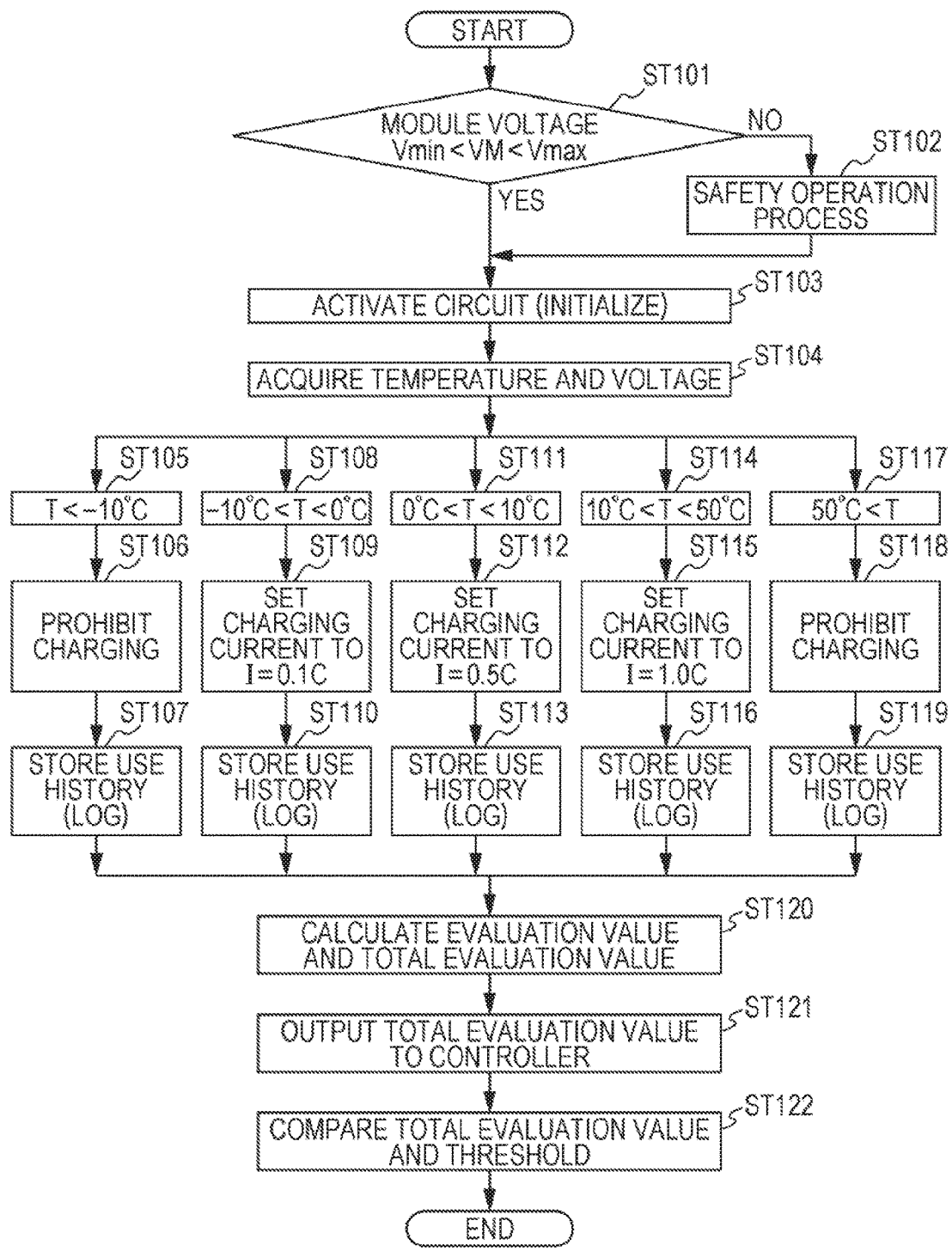
FIG. 6 is a flowchart illustrating an example of the flow of a process in a first embodiment.

FIG. 6 is a flowchart illustrating an example of the flow of the process in the first embodiment. For example, the power storage module MOD is activated by turning on the switch provided for the controller ICNT.

With the module controller CTN1 of the power storage module MOD, the voltage (module voltage) VM of the power storage module MOD is acquired. Whether the module voltage VM is in a certain range (Vmin to Vmax) or not is determined (Step ST101). Specifically, whether the minimum voltage of the plurality of batter blocks is greater than Vmin is determined and whether the maximum voltage of the plurality of battery blocks is less than Vmax or not is determined.

When the module voltage VM is out of the certain range (Vmin to Vmax), a safety operation process is performed (Step ST102). When the module voltage VM is out of the certain range (Vmin to Vmax), the power storage unit is in the overcharged or overdischarged state. In view of this, in the safety operation process, in the occurrence of the overcharging, the power storage unit is forcibly discharged and in the occurrence of the overdischarging, the preliminary charging by a preliminary charging circuit (not shown) is performed. Through the safety operation process, the module voltage VM stays within the certain range (Vmin to Vmax).

When the module voltage VM is in the certain range (Vmin to Vmax), each circuit in the power storage module MOD is activated and the initialization (initialize) process is executed as necessary (Step ST103).

After the activation of the circuit, the module controller CTN1 acquires the voltage of the battery block. Moreover, the module controller CTN1 acquires the temperature information from the temperature detector 15 (Step ST104). In accordance with the temperature indicated by the temperature information, the charging current is set.

When the temperature T is lower than −10 degC., the control is made to prohibit the charging. The use history (log) in this temperature range is stored in the memory 23 (Step ST105, Step ST106, Step ST107). When the temperature T is higher than −10 degC. and lower than 0 degC., the control is made to set the charging current to 0.1 C. The use history in this temperature range is stored in the memory 23 (Step ST108, Step ST109, Step ST110). When the temperature T is higher than 0 degC. and lower than 10 degC., the control is made to set the charging current to 0.5 C. The use history in this temperature range is stored in the memory 23 (Step ST111, Step ST112, Step ST113).

When the temperature T is higher than 10 degC. and lower than 50 degC., normal charging is performed. For example, the control is made to set the charging current to 1.0 C. Note that the charging current may be changed for the quick charging, or the like. The use history in this temperature range is stored in the memory 23 (Step ST114, Step ST115, Step ST116). When the temperature T is higher than 50 degC., the control is made to prohibit the charging. The use history in this temperature range is stored in the memory 23 (Step ST117, Step ST118, Step ST119).

With reference to the use history of the power storage module MOD1 stored in the memory 23, the control unit 7 executes the process of calculating the evaluation value and the value based on the evaluation value (Step ST120). The evaluation value is, for example, calculated based on Formulae (1) to (3) above. Note that the timing of the process of Step ST120 can be set as appropriate.

For example, in response to the request from the controller ICNT, the total evaluation value is output from the control unit 7 to the communication unit COM1. Then, the total evaluation value is output to the controller ICNT through the communication unit COM1 (Step ST121).

The total evaluation value transmitted from the power storage module MOD is received by the controller ICNT. Then, the total evaluation value is acquired by the control unit 30 of the controller ICNT. As described above, the control unit 30 compares the total evaluation value with the threshold and executes the process in accordance with the comparison result (Step ST122).

Although FIG. 6 illustrates the setting of the charging current only, the discharging current is set in accordance with the temperature as appropriate. For example, when the discharging is performed in the temperature range of lower than −20 degC., the discharging current is set to, for example, 1.0 C. When the discharging is performed in the temperature range of −20 degC. to 60 degC., the discharging current is set to, for example, 2.0 C. When the temperature is higher than 60 degC., the discharging is prohibited. The use history such as the discharging time at each temperature is stored in the memory 23.

As described above, according to the first embodiment of the present technology, it is possible to accurately know the deterioration in performance of the power storage unit of the power storage module MOD. In the occurrence of the deterioration of the power storage unit, the user can be notified with the warning, or the like. As necessary, the operation of the power storage system is stopped so that the power storage system can be used safely.

Modified Example of First Embodiment

The aforementioned first embodiment can be modified as below, for example. When the temperature detector 15 is constructed by a plurality of temperature detection elements, for example, the average value or the intermediate value of the temperatures detected by the plurality of temperature detection elements is used. Whether the region is either Region 1 or Region 2 may be determined based on the minimum temperature of the temperatures detected by the plurality of temperature detection elements. Moreover, whether the region is either Region 3 or Region 4 may be determined based on the maximum temperature of the temperatures detected by the plurality of temperature detection elements.

In the aforementioned first embodiment, the controller ICNT executes the process based on the total evaluation value; however, the control unit 7 of the power storage module MOD may execute the process based on the total evaluation value. For example, the control unit 7 may compare the total evaluation value and the threshold and output the signal in accordance with the comparison result to the controller ICNT.

In the aforementioned first embodiment, the evaluation values of the regions other than Region 3 are obtained; however, the evaluation values of the entire regions may be acquired assuming that the integral time coefficient of Region 3 is 0. The use of the power storage module MOD in Region 3 does not drastically promote the deterioration of the power storage module MOD; thus, the integral time coefficient is set to 0 or decreased (for example, to about 0.1), thereby preventing the total evaluation value from becoming large.

The structure in which the charging is possible in the temperature range of lower than −20 degC. may also be employed. In this case, the charging current is set smaller, and the integral time coefficient is set larger than 1.0.

In the aforementioned first embodiment, the functions executed by the control unit 7 may be executed entirely or partly by the MCU 21. Moreover, a dedicated microcomputer for executing the above processes may be provided.

2. Second Embodiment

Next, a second embodiment is described. The structure of the power storage module MOD and the controller ICNT in the second embodiment is similar to that of the first embodiment. The components described in the first embodiment can apply to the second embodiment unless otherwise stated.

In the second embodiment, the use condition of the power storage unit is changed when the total evaluation value exceeds the threshold. Moreover, the evaluation value in each region is acquired by changing the integral time coefficient in the region based on the temperature.

For example, when the control unit 30 of the controller ICNT determines that the total evaluation value is greater than 7000 hours, the warning is displayed. When the control unit 30 of the controller ICNT determines that the total evaluation value is greater than 10000 hours, the operation of the power storage system is forcibly stopped. Here, the stop of the operation of the power storage system may cause the inconvenience in the place having no commercial power source because the power cannot be used. For example, in the medical institution, the stop of the power supply can endanger the life of patients. Even in the place having the commercial power source, the stored power of the power storage system cannot be used so that the user feels inconvenience. In view of these, when the total evaluation value exceeds a certain threshold, the use condition of the power storage unit is changed and the progress of deterioration of the power storage module MOD is suppressed, thereby delaying the time where the condition for stopping the power storage system is satisfied.

In the second embodiment, for example, when the total evaluation value exceeds 7000 hours, the use condition of the power storage unit is changed by restricting the charging current and the discharging current. For example, the control is made to restrict the charging current and the discharging current to approximately a half. By restricting the charging current and the discharging current, the load applied to the electrode can be reduced.

Moreover, the integral time coefficient in the region based on the temperature is reset and the evaluation value is acquired. The region based on the temperature may be reset. Note that as the process performed before the total evaluation value exceeds 7000 hours, the process in the first embodiment described above can be applied.

Figure 7:
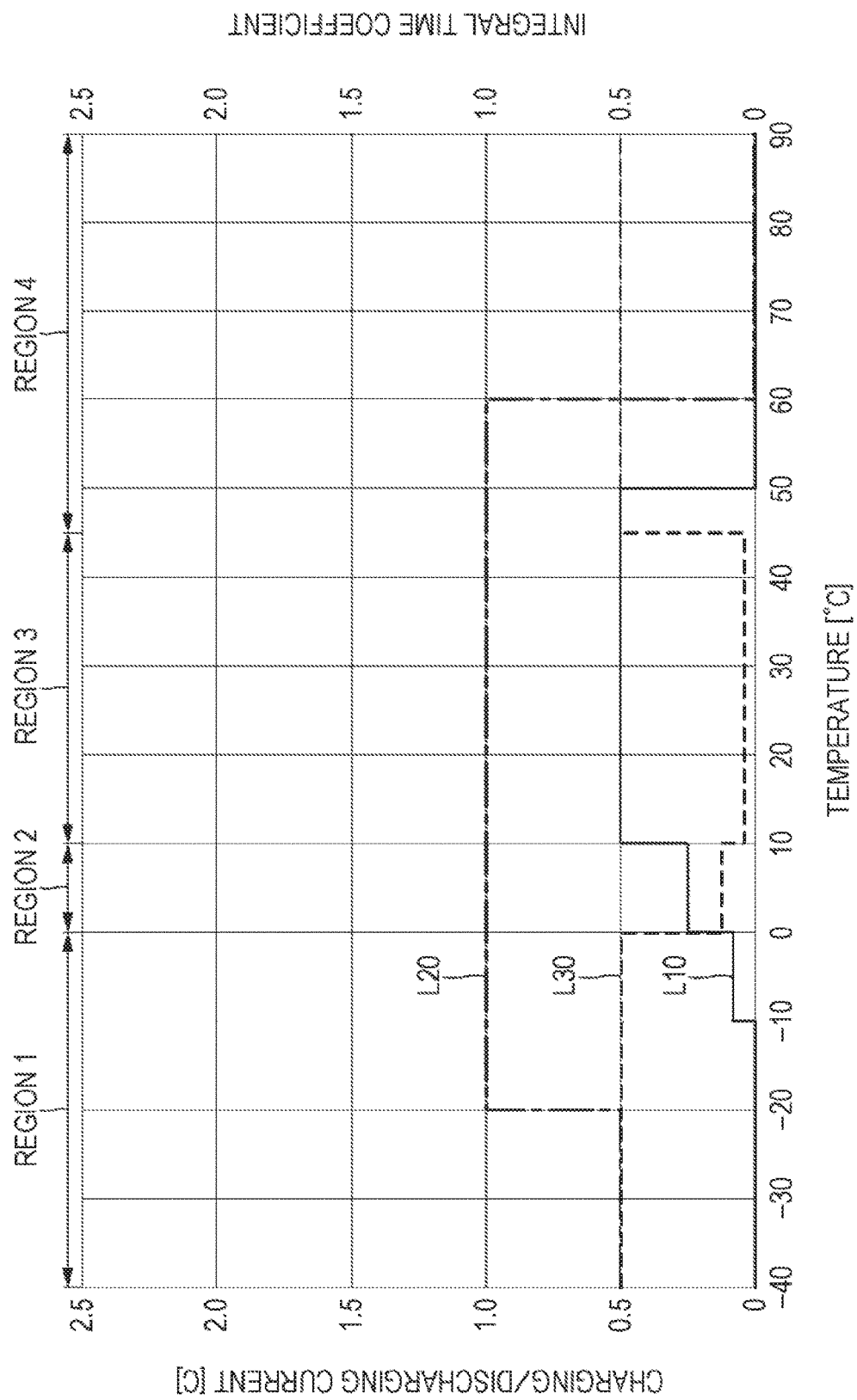
FIG. 7 is a diagram illustrating an example of the charging current, discharging current, and integral time coefficient depending on temperature.

FIG. 7 illustrates an example of the charging current, the discharging current, and the integral time coefficient that are reset when the total evaluation value exceeds 7000 hours. The graph L10 of the solid line in FIG. 7 represents the magnitude of the charging current. The magnitude of the charging current is restricted by the control unit 7 of the module controller CTN1 in accordance with the control by the controller ICNT, for example. For example, the charging of the power storage module MOD in the temperature range of less than −10 degC. is prohibited. The charging current in the temperature range of −10 degC. to 0 degC. is changed from, for example, 0.2 C to 0.1 C. The charging current in the temperature range of 0 degC. to 10 degC. is changed from, for example, 0.5 C to 0.25 C. The charging current in the temperature range of 10 degC. to 50 degC. is changed from, for example, 1.0 C to 0.5 C.

The graph L20 of the alternate long and short dash line in FIG. 7 represents the magnitude of the discharging current. The magnitude of the discharging current is restricted by the control unit 7 of the module controller CTN1 in accordance with the control by the controller ICNT, for example. For example, the discharging current in the temperature range of less than −20 degC. is changed from 1.0 C to 0.5 C. The discharging current in the temperature range of −20 degC. to 60 degC. is changed from 2.0 C to 1.0 C. The discharging of the power storage module MOD in the temperature range of higher than 60 degC. is prohibited.

As the region based on the temperature, for example, regions as below are set.

Region 1: the temperature measured by the temperature detector 15 is in the range of lower than 0 degC.

Region 2: the temperature measured by the temperature detector 15 is in the range of higher than 0 degC. and lower than 10 degC.

Region 3: the temperature measured by the temperature detector 15 is in the range of higher than 10 degC. and lower than 45 degC.

Region 4: the temperature measured by the temperature detector 15 is in the range of higher than 45 degC.

The integral time coefficient in each region is reset. As indicated by the dotted line L30 in FIG. 7, 0.5 is set as the integral time coefficient in Region 1, 0.15 is set as the integral time coefficient in Region 2, 0.05 is set as the integral time coefficient in Region 3, and 0.5 is set as the integral time coefficient in Region 4.

The control unit 7 acquires at least the evaluation value in the low-temperature region and the evaluation value in the high-temperature region. In this example, the control unit 7 acquires the evaluation values in all the regions including Region 3.

The evaluation value in Region 1 is obtained by, for example, Formula (4) below:

(Integral time obtained by integrating the time for which the power storage unit is charged in the temperature range of lower than 0degC.)*integral time coefficient (0.5)   (4)

The evaluation value in Region 2 is obtained by, for example, Formula (5) below:

(Integral time obtained by integrating the time for which the power storage unit is charged in the temperature range of higher than 0degC. and lower than 10degC.)*integral time coefficient (0.15)   (5)

The evaluation value in Region 3 is obtained by, for example, Formula (6) below:

(Integral time obtained by integrating the time for which the power storage module MOD is used in the temperature range of higher than 10degC. and lower than 45degC.)*integral time coefficient (0.05)   (6)

The evaluation value in Region 4 is obtained by, for example, Formula (7) below:

(Integral time obtained by integrating the time for which the power storage module MOD is used in the temperature range of higher than 45degC.)*integral time coefficient (0.5)   (7)

The control unit 7 acquires the temperature based on the temperature information supplied from the temperature detector 15, and stores the use history such as the charging time at each temperature in the memory 23. Then, with reference to the use history stored in the memory 23, the control unit 7 obtains the evaluation value in each region by using the above Formulae (4) to (7) at appropriate timing, and calculates the value based on the evaluation value.

The value based on the evaluation value refers to the value obtained by adding 7000 hours to the value obtained by summing up the evaluation value from Formula (4), the evaluation value from Formula (5), the evaluation value from Formula (6), and the evaluation value from Formula (7). This value (total evaluation value) is stored in the memory 23 as the accumulative time information representing the deterioration degree of the power storage module MOD. Upon the acquisition of the new total evaluation value, the total evaluation value is updated total evaluation value is stored in the memory 23.

The control unit 7 executes the control in accordance with the total evaluation value. For example, in response to the request from the controller ICNT, the control unit 7 outputs the total evaluation value to the communication unit COM1. By the control of the MCU 21 in the communication unit COM1, the total evaluation value is transmitted to the controller ICNT through the communication terminal 20. Note that the total evaluation value may be output while being associated with the ID for identifying the power storage module MOD.

The controller ICNT receives in the communication unit 31, the data representing the total evaluation value transmitted from the power storage module MOD. The data representing the total evaluation value are supplied from the communication unit 31 to the control unit 30. The control unit 30 acquires the total evaluation value by performing a demodulation process or the like on the data representing the total evaluation value as appropriate.

The control unit 30 compares the total evaluation value with the threshold. The control unit 30 outputs the stop notification signal when the total evaluation value exceeds 9000 hours. The control unit 30 may output the maintenance inspection calling signal. When the total evaluation value exceeds 10000 hours, the control unit 30 outputs the stop signal. In response to the stop signal, the operation of the power storage system is stopped and the charging and discharging by the power storage system are prohibited. As these processes, the processes described in the first embodiment can be applied.

As thus described, in the second embodiment, when the total evaluation value exceeds the threshold (for example, 7000 hours), the warning is displayed and the setting of the charging and discharging of the power storage module MOD is changed to the method causing less deterioration. Since the setting of the charging and discharging is changed to the method causing less deterioration of the power storage unit, the integral time coefficient is reset to be smaller. Therefore, it is possible to delay the time where the total evaluation value reaches the threshold at which the power storage system is stopped (for example, 10000 hours). By performing the maintenance inspection of the power storage system before the total evaluation value reaches the threshold at which the power storage system is stopped (for example, 10000 hours), the stop of the power storage system can be prevented. Thus, the inconvenience caused by the stop of the power storage system can be avoided.

Modified Example of Second Embodiment

In the second embodiment, the charging current and the discharging current are restricted as the use condition of the power storage unit. However, the full charge voltage may be changed instead. The setting of the full charge voltage is performed by the control unit 7 of the module controller CTN1 in accordance with the control by the controller ICNT.

For example, the full charge voltage is set as below before the total evaluation value exceeds 7000 hours.

In the temperature range of −10 degC. to 0 degC., the full charge voltage is set to 4.10 V.

In the temperature range of 0 degC. to 10 degC., the full charge voltage is set to 4.15 V. In the temperature range of 10 degC. to 45 degC., the full charge voltage is set to 4.20 V.

For example, the full charge voltage is set as below when the total evaluation value exceeds 7000 hours.

In the temperature range of −10 degC. to 0 degC., the full charge voltage is set to 4.00 V.

In the temperature range of 0 degC. to 10 degC., the full charge voltage is set to 4.05 V.

In the temperature range of 10 degC. to 45 degC., the full charge voltage is set to 4.20 V.

In addition to restricting the charging current and the discharging current, the control may be performed to decrease the full charge voltage.

3. Third Embodiment

Next, a third embodiment is described. The structure of the power storage module MOD and the controller ICNT in the third embodiment is similar to that of the first embodiment, for example. The components described in the first and second embodiments can apply to the third embodiment unless otherwise stated.

In the aforementioned first embodiment and the second embodiment, the controller acquires the total evaluation value from each power storage module. In the third embodiment, the controller acquires the value based on the evaluation value (for example, total evaluation value) from only a particular power storage module (hereinafter referred to as a reference power storage module as appropriate) among a plurality of power storage modules. Based on the total evaluation value acquired by the controller, the deterioration degree of the power storage system is determined.

For example, the controller ICNT acquires the total evaluation vale in one reference power storage module MOD out of 16 power storage modules MODs. The controller ICNT determines whether the acquired evaluation value is greater than the threshold (for example, 7000 hours, 9000 hours and 10000 hours). Based on the result of determination, the warning or the like is displayed. When the total evaluation value is greater than a predetermined threshold, for example, all the power storage modules MODs included in the power storage system are subjected to the maintenance inspection, for example. Note that as the process of comparing the total evaluation value and the threshold or the process performed based on the comparison result, the process described in the first embodiment can be applied.

The load of communication between the controller ICNT and the power storage module MOD can be reduced by which the controller ICNT acquires the total evaluation value only from the reference power storage module. Note that the number of reference power storage modules may be more than one.

Figure 8:
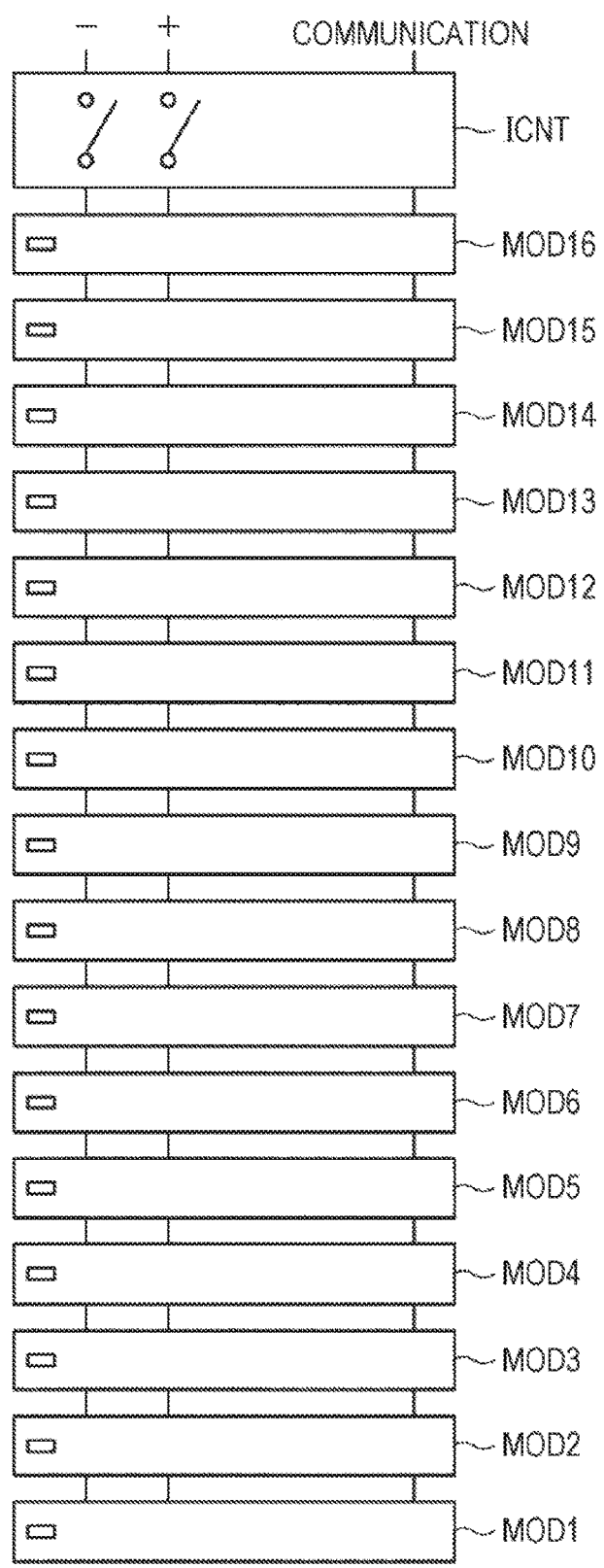
FIG. 8 is a diagram illustrating an example of arrangement of a power storage system.

Among the plurality of power storage modules, the reference power storage module may be set in accordance with the temperature distribution. FIG. 8 illustrates an example of arrangement of the power storage system. In the example illustrated in FIG. 8, the power storage modules are stacked sequentially from the power storage module MOD1, and the controller ICNT is disposed in the uppermost stage. The controller ICNT and each power storage module are connected through a positive power line, a negative power line, and a communication line. The controller ICNT and each power storage module are supported by a rack with a predetermined shape (not shown). The controller ICNT can specify the position of each power storage module by performing the initial communication with each power storage module, for example, and sets the power storage module from which the total evaluation value is acquired.

Since the amount of heat generation of the controller ICNT is generally large, the temperature of the power storage module MOD16 positioned right below the controller ICNT tends to be high. In other words, the deterioration of the power storage module MOD16 may progress more quickly than the other power storage modules MODs. On the other hand, the temperature of the power storage module MOD in the lowest stage apart from the controller ICNT tends to be low. Depending on the temperature of the external air, the deterioration of the power storage module MOD1 may progress more quickly than the other power storage modules MODs. In view of this, the power storage module MOD1 and the power storage module MOD16, which are considered to deteriorate easily from the temperature distribution, are selected as the reference power storage modules.

The controller ICNT acquires the total evaluation values of the power storage module MOD1 and the power storage module MOD16. The controller ICNT compares the total evaluation values and the threshold. When at least one total evaluation value exceeds the threshold (for example, 7000 hours), the warning is displayed. For the details of the process, the process described in the first embodiment can be applied.

Note that when the total evaluation value exceeds a certain threshold and it determined that the maintenance is necessary, any of the power storage module MOD1 and the power storage module MOD16 may be maintained, or both power storage modules may be maintained. Moreover, other power storage modules MODs such as the power storage module MOD2 may be maintained additionally.

It is considered that the deterioration of the power storage module MOD1 and the power storage module MOD16 is more severe than that of the power storage module MOD2 and the like. Therefore, the deterioration of at least one of the power storage module MOD1 and the power storage module MOD16 may be determined and the other power storage modules MODs may be maintained based on that result. The controller ICNT and at least one of the power storage module MOD1 and the power storage module MOD16 may communicate with each other; thus, the communication load can be reduced to simplify the process.

Note that the controller ICNT may acquire the evaluation value in the low-temperature region (for example, Region 1 and Region 2) from the power storage module MOD1. Moreover, the evaluation value in the high-temperature region (for example, Region 3) may be acquired from the power storage module MOD16. The controller ICNT may calculate the total evaluation value from the two evaluation values obtained, and compare the total evaluation value and the threshold.

For obtaining the correct temperature, a dedicated temperature detection element may be provided. In this case, for example, the temperature detection element may be provided on the surface of the power storage module MOD16 or in the vicinity of the center of the inside (for example the vicinity of the module balance control circuit MBC), which is considered to have the highest temperature, and in the vicinity of the side surface of the power storage module MOD1, which is considered to have the lowest temperature. It is not necessary to provide the temperature detection element in the other power storage modules MODs, and the correct temperature can be measured by a minimum number of temperature detection elements. The temperature detection element may be attached to the rack that supports the power storage system.

Figure 9:
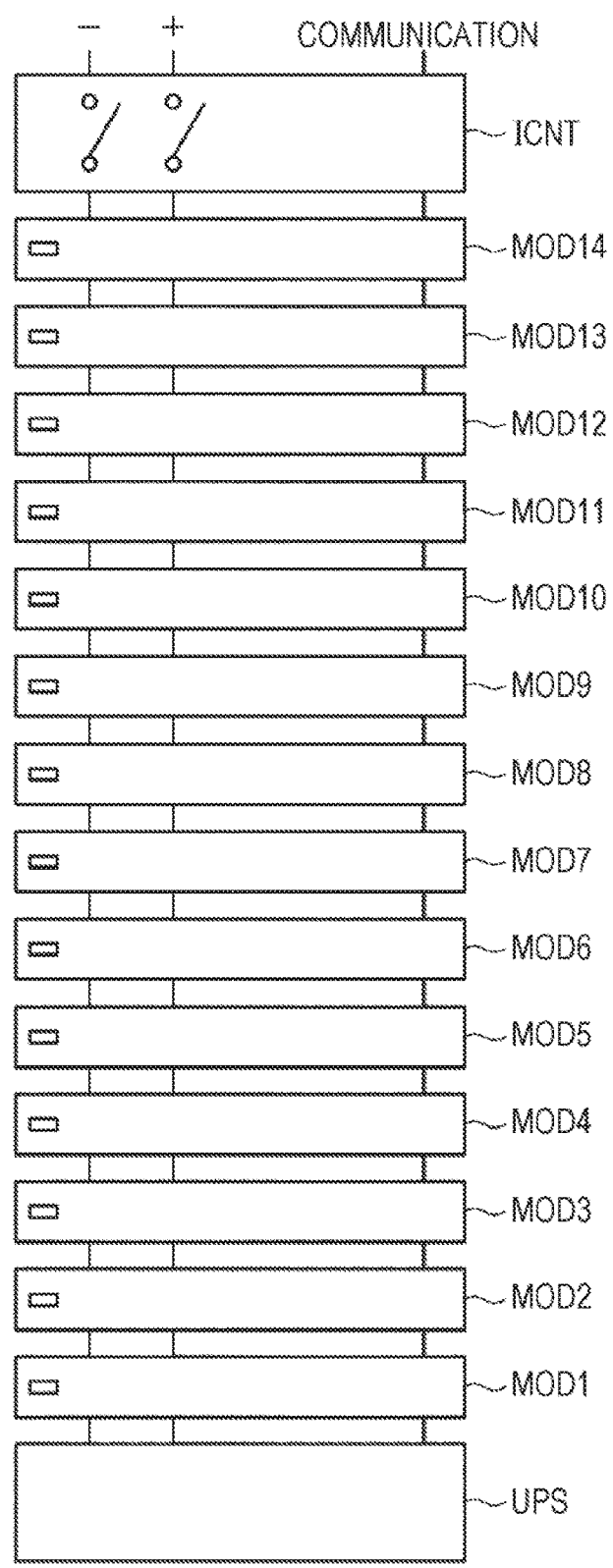
FIG. 9 is a diagram illustrating another example of the arrangement of the power storage system.

FIG. 9 illustrates another example of the arrangement of the power storage system. In the example illustrated in FIG. 9, Uninterruptible Power Supply (UPS) is disposed in the lowest stage, and the power storage modules (MOD1 to MOD14) are sequentially stacked on the UPS, and the controller ICNT is disposed in the uppermost stage. The controller ICNT, UPS, and each power storage module are connected through a positive power line, a negative power line, and a communication line. The controller ICNT, each power storage module, and UPS are supported by the rack (not shown). UPS has, for example, a power storage unit including a lead acid battery or the like, and an inverter device (these are not shown).

In the example illustrated in FIG. 9, the power storage module MOD1 located closest to UPS tends to have the high temperature. On the other hand, the vicinity of the side surface of the case of the power storage module MOD7 located far from the heat generator (UPS and controller ICNT) tends to have the low temperature. In view of this, the power storage module MOD1 and the power storage module MOD7 are selected as the reference power storage modules.

The controller ICNT acquires the total evaluation values of the power storage module MOD1 and the power storage module MOD7. The controller ICNT compares each total evaluation value and the threshold. When at least one total evaluation value is greater than the threshold (for example, 7000 hours), the warning is displayed. For the details of the process, the process described in the first embodiment can be applied.

When the maintenance is necessary, any of the power storage module MOD1 and the power storage module MOD7 may be maintained, or both power storage modules may be maintained. Further, other power storage modules MODs such as the power storage module MOD2 may be maintained additionally.

It is considered that the deterioration of the power storage module MOD1 and the power storage module MOD7 is more severe than that of the power storage module MOD2 and the like. Therefore, the deterioration of at least one of the power storage module MOD1 and the power storage module MOD7 may be determined and the other power storage modules MODs may be maintained based on that result. The controller ICNT and at least one of the power storage module MOD1 and the power storage module MOD7 may communicate with each other; thus, the communication load can be reduced to simplify the process.

Note that the controller ICNT may acquire the evaluation value in the low-temperature region (for example, Region 1 and Region 2) from the power storage module MOD7. Moreover, the evaluation value in the high-temperature region (for example, Region 3) may be acquired from the power storage module MOD1. The controller ICNT may calculate the total evaluation value from the two evaluation values obtained, and compare the total evaluation value and the threshold.

For obtaining the correct temperature, a dedicated temperature detection element may be provided. It is preferable that the temperature detection element is provided directly to the battery of the power storage unit, or provided at an appropriate position in the vicinity of the center and/or the peripheral part of the batteries in the exterior of the power storage unit. For example, the temperature detection element may be provided on the surface of the power storage module MOD1 or in the vicinity of the center of the inside (for example the vicinity of the module balance control circuit MBC), which is considered to have the highest temperature, and in the vicinity of the side surface of the power storage module MOD7, which is considered to have the lowest temperature. Alternatively, the temperature detection element may be attached to the rack that supports the power storage system. The correct temperature can be measured by a minimum number of temperature detection elements by employing the above structure.

4. Application Examples

Next, application examples of the present technology are described. Note that the present technology is not limited to the application examples described below. The components described in the first embodiment, the second embodiment, and the third embodiment can be applied to the application examples.

Application Example 1

Figure 10:
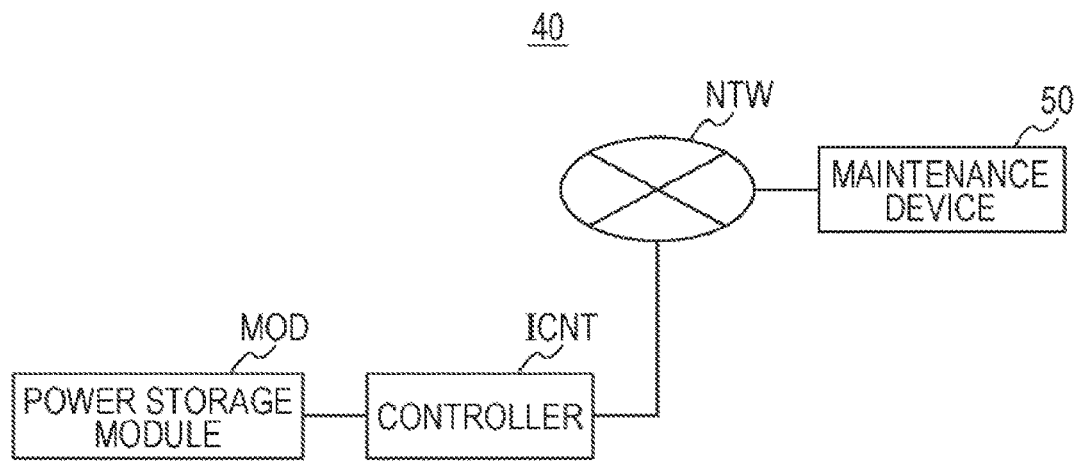
FIG. 10 is a diagram illustrating an example of a maintenance system.

Application Example 1 is the example in which the present technology is applied to a maintenance system for maintaining a power storage system. FIG. 10 illustrates the summary of a maintenance system 40 in Application Example 1. As described above, one or a plurality of power storage modules MODs is connected to the controller ICNT. The controller ICNT is connected to a maintenance device 50 through the network NTW. The maintenance device 50 is installed in such as companies that are engaged in maintenance and management of power storage systems. As the network NTW, a public line such as the Internet can be used.

Figure 11:
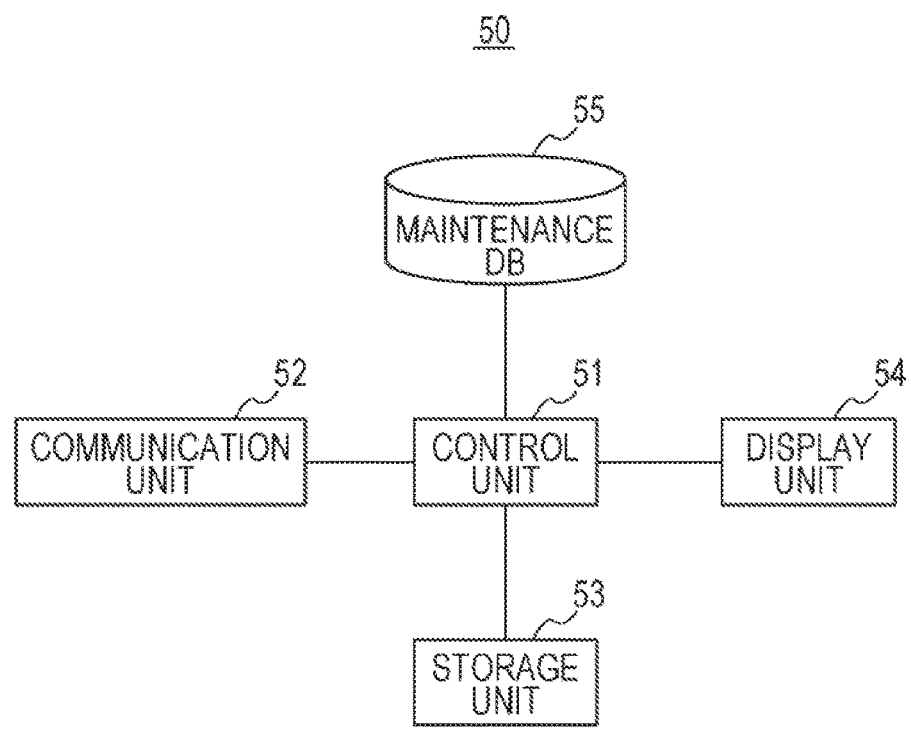
FIG. 11 is a diagram illustrating an example of a structure of a maintenance device.

FIG. 11 illustrates an example of the structure of the maintenance device 50. The maintenance device 50 includes, for example, a control unit 51, a communication unit 52, a storage unit 53, a display unit 54, and a maintenance database (DB) 55.

The control unit 51 includes, for example, a CPU, and controls each unit of the maintenance device 50. The communication unit 52 communicates with the controller ICNT in the power storage system. For example, the communication unit 52 receives signals transmitted from the controller ICNT. Note that the communication unit 52 may communicate with another maintenance device (for example, maintenance device that geographically manages the power storage system that needs to be maintained) or a portable terminal of an operator who is in charge of maintaining the power storage system (hereinafter referred to as a maintenance operator as appropriate).

The storage unit 53 includes, for example, a ROM and a RAM. The ROM stores programs to be executed by the control unit 51. The RAM is used as the work memory when the control unit 51 executes the process or used as a region storing the data temporarily.

The display unit 54 includes a driver and a display panel. The display unit 54 displays various pieces of information including information in regard to the maintenance of the power storage system. The maintenance database 55 is a high-capacity recording device in which the pieces of information in regard to the maintenance of the power storage system are accumulated. For example, the history regarding the maintenance in units of power storage systems and power storage modules is accumulated in the maintenance database 55. Moreover, the location of the power storage system and the contact address of the users are accumulated in the maintenance database 55 while being associated with the user information. Note that the maintenance database 55 may be a server device (so-called cloud computer) connected to the network NTW.

An example of the operation of each device in the maintenance system 40 is described. The controller ICNT transmits the maintenance inspection calling signal when the total evaluation value acquired from the power storage system is greater than a certain threshold (for example, 9000 hours). Here, the display unit 33 of the controller ICNT may display the message indicating that the maintenance request is currently made.

The maintenance inspection calling signal is received by the communication unit 52 of the maintenance device 50 through the network NTW. The maintenance inspection calling signal includes the user information of the power storage system, for example. The maintenance inspection calling signal received by the communication unit 52 is supplied to the control unit 51.

The control unit 51 specifies the power storage system that needs the maintenance inspection with reference to the user information included in the maintenance inspection calling signal and the information accumulated in the maintenance database 55. The control unit 51 executes the process in regard to the maintenance of the power storage system. For example, the control unit 51 sets the optimum time for exchanging the power storage module in the power storage system. The control unit 51 transmits the notification signal to the maintenance operator upon the reception of the maintenance inspection calling signal or at the set exchange time, with the use of the communication unit 52. Note that the information based on the user information or the like may be displayed on the display unit 54.

The notification signal transmitted from the maintenance device 50 is received by, for example, the portable terminal owned by the maintenance operator. The maintenance operator having confirmed the notification goes to the place where the power storage system is installed, and performs the following work, for example.

Reset the display based on the output of the warning signal or stop notification signal, and execute the necessary resetting.

Execute the resetting of the module controller CTN1.

Exchange the power storage module MOD and reset the necessary data. Note that the power storage module MOD to be exchanged may be all the power storage modules MODs or just deteriorated power storage modules MODs of the power storage system.

According to Application Example 1, when the maintenance of the power storage system has become necessary, the maintenance device is automatically notified; therefore, the user does not need to perform the maintenance in regard to the important matter. As a result, the operation of the power storage system can be continued. Further, the maintenance can be performed as planned at the optimum timing in accordance with the use circumstances of the power storage system; thus, the cost of the maintenance can be reduced. Although it is difficult for a user to notice the deterioration in the use of the power storage system, Application Example 1 makes it possible to correctly detect the deterioration of the power storage system and manage the power storage system optimally.

The third embodiment can be modified as below. In the occurrence of a trouble in the power storage system, the notification may be transmitted from the controller ICNT to the maintenance device.

A label on which the contact address of the service center is written may be attached at a predetermined position of the power storage system. Separate from the aforementioned maintenance, the user can contact the address on the label voluntarily.

The maintenance inspection calling signal may be transmitted from the controller ICNT to the maintenance device 50 when the warning is displayed. The controller ICNT may transmit the maintenance inspection calling signal when the total evaluation value is greater than 7000 hours.

Application Example 2

Figure 12:
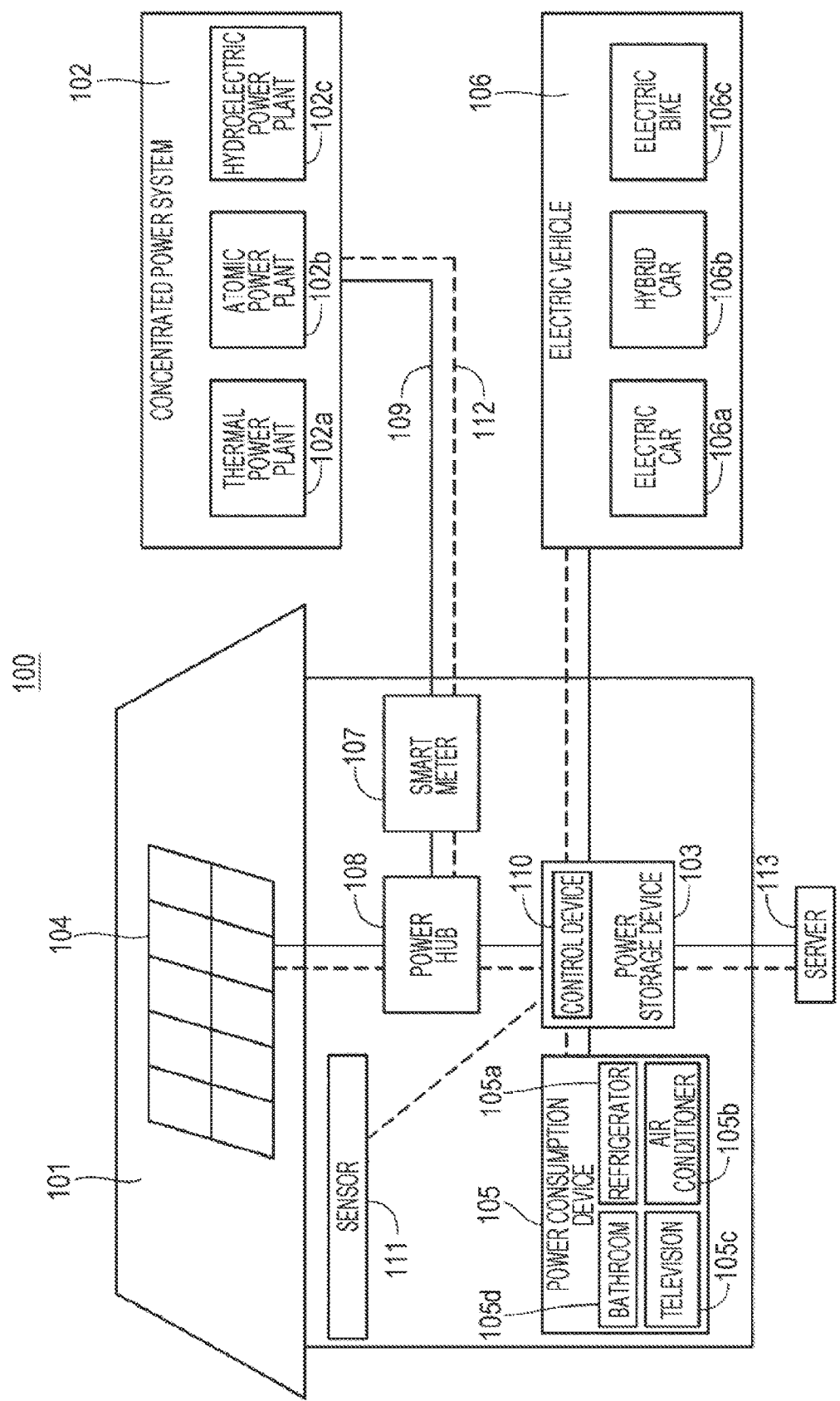
FIG. 12 is a diagram illustrating an application example.

An example in which the present technology is applied to a power accumulation device for a house is described with reference to FIG. 12. For example, in a power accumulation device 100 for a house 101, the electric power is supplied from a concentrated power system 102 such as a thermal power plant 102*a*, an atomic power plant 102*b*, or a hydroelectric power plant 102*c* through a power network 109, an information network 112, a smart meter 107, a power hub 108, or the like to the power storage device 103. In addition, the electric power is supplied to the power storage device 103 from an independent power source such as an in-house power generation device 104. The electric power supplied to the power storage device 103 is accumulated. With the use of the power storage device 103, the electric power to be consumed in the house 101 is supplied. The similar power accumulation device can be used not just in the house 101 but also in the building.

The house 101 is provided with a control device 110 that controls each device of the in-house power generation device 104, a power consumption device 105, the power storage device 103, and the like, the smart meter 107, and a sensor 111 that acquires various pieces of information. The devices are connected by the power network 109 and the information network 112. As the in-house power generation device 104, a solar cell, a fuel cell, and the like are used and the generated power is supplied to the power consumption device 105 and/or the power storage device 103. The power consumption device 105 corresponds to a refrigerator 105*a*, an air conditioner 105*b*, a television receiver 105*c*, a bathroom 105*d*, and the like. Moreover, an electric vehicle 106 is also included in the power consumption device 105. The electric vehicle 106 corresponds to an electric car 106*a*, a hybrid car 106*b*, and an electric bike 106*c*.

As the power storage device 103, the aforementioned power storage system can be used. The power storage device 103 can be installed either inside or outside the house. In either case, the state (deterioration degree) of the power storage device 103 can be correctly known by applying the present technology. The smart meter 107 has the function of measuring the consumption amount of the commercial power and transmitting the measured amount to the power company. As the power network 109, any of or a plurality of DC power supply, AC power supply, and noncontact power supply may be used.

As the various sensors 111, for example, a motion sensor, an illuminance sensor, an object detection sensor, a consumption power sensor, a vibration sensor, a contact sensor, a temperature sensor, an infrared ray sensor, or the like can be used. The information acquired by the sensor 111 is transmitted to the control device 110. By the use of the information from the sensor 111, the state of weather or the state of a person is known and the power consumption device 105 is automatically controlled to minimize the energy consumption. Moreover, the control device 110 can transmit the information in regard to the house 101 to the power company on the outside through the Internet.

By the power hub 108, the branching of the power line or the conversion between DC and AD is performed. As the communication method of the information network 112 connected to the control device 110, a method of using the communication interface such as Universal Asynchronous Receiver-Transmitter (UART: asynchronous serial communication transmission/reception circuit), or a method of using a sensor network based on the wireless communication specification such as Bluetooth (registered trademark), ZigBee (registered trademark), or Wi-Fi (registered trademark) is given. Bluetooth method is applied to the multimedia communication and one-to-many communication is possible. ZigBee uses the Institute of Electrical and Electronics Engineers (IEEE) 802.15.4 physical layer. IEEE 802.15.4 is the name of the short-range wireless network specification called Personal Area Network (PAN) or Wireless (W) PAN.

The control device 110 is connected to an external server 113. This server 113 may be managed by any of the house 101, the power company, and the service provider. The information transmitted to and received from the server 113 is, for example, the information in regard to the power consumption information, the life pattern information, the power rate, the weather information, the natural calamity information, and the electric power transaction. These pieces of information may be transmitted to or received from the power consumption device in the house (such as a television receiver) or the device outside the house (such as a cellular phone). These pieces of information may be displayed on the equipment with the display function, such as a television receiver, a cellular phone, or a Personal Digital Assistant (PDA).

The control device 110 controlling each unit includes a CPU, a RAM, a ROM, or the like, and in this example, housed in the power storage device 103. As the function of the control device 110, the function of the controller ICNT can be applied. The control device 110 is connected to the power storage device 103, the in-house power generation device 104, the power consumption device 105, the various sensors 111, and the server 113 through the information network 112, and has the function of adjusting the use amount of commercial power and the amount of power generation. In addition, the control device 110 may have the function of the electric power transaction in the power market.

As thus described, the generated power can be accumulated in the power storage device 103 from the in-house power generation device 104 (solar power generation, wind power generation) in addition to the concentrated power system 102 such as the thermal power plant 102a, the atomic power plant 102b, or the hydroelectric power plant 102c. Therefore, even though the power generated from the in-house power generation device 104 fluctuates, the control can be made so that the amount of power to be supplied to the outside can be made constant or just a necessary amount of power is discharged. For example, the power obtained from the solar power generation is accumulated in the power storage device 103 and the midnight power, which is the power that costs less in the nighttime, is accumulated in the power storage device 103 during the nighttime and in the daytime, the power accumulated in the power storage device 103 is discharged to be used.

Although this example has described the case in which the control device 110 is housed in the power storage device 103, the control device 110 may be housed in the smart meter 107 or may be configured alone. Moreover, the power accumulation device 100 may be used in a plurality of rooms in a condominium or a plurality of houses.

Application Example 3

Figure 13:
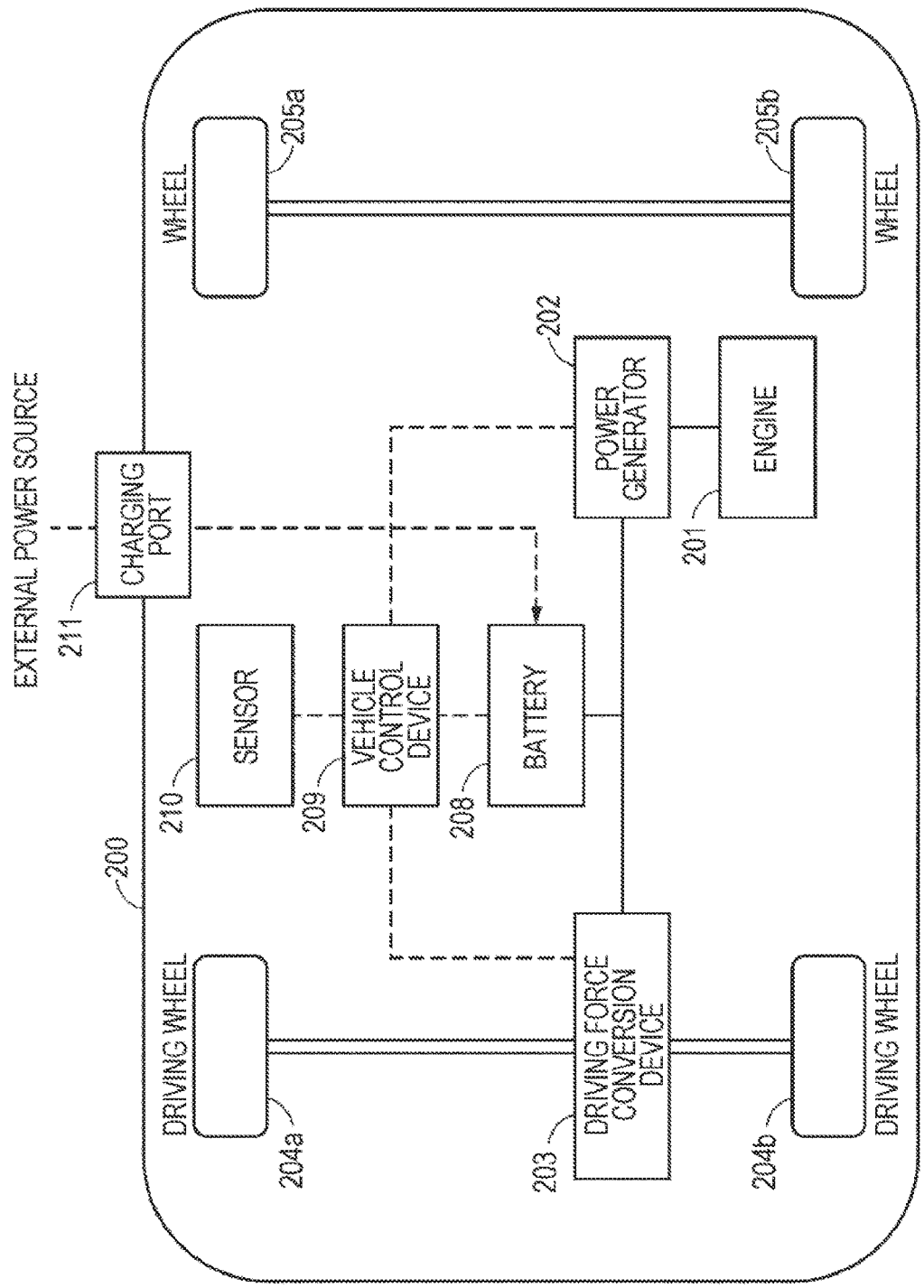
FIG. 13 is a diagram illustrating another application example.

An example in which the present technology is applied to a power accumulation device for a vehicle is described with reference to FIG. 13. FIG. 13 schematically illustrates an example of the structure of a hybrid vehicle employing a series hybrid system to which the present technology is applied. The series hybrid system refers to a car driven by the power driving force conversion device by using the power generated by a power generator, which is driven by an engine, or the power obtained by accumulating the aforementioned power in a battery for a while.

This hybrid vehicle 200 includes an engine 201, a power generator 202, a power driving force conversion device 203, a driving wheel 204a, a driving wheel 204b, a wheel 205a, a wheel 205b, a battery 208, a vehicle control device 209, a sensor 210, and a charging port 211. As the battery 208, the aforementioned power storage system can be applied.

The hybrid vehicle 200 is usually parked outside the house. In the mountains in winter, the ambient temperature may be as low as −20 degC. Even under such circumstances, the present technology can determine the state of the battery 208 (deterioration degree) correctly.

The hybrid vehicle 200 runs using the power driving force conversion device 203 as a driving source. An example of the power driving force conversion device 203 corresponds to a motor. By the power from the battery 208, the power driving force conversion device 203 operates, and the rotation force of the power driving force conversion device 203 is transmitted to the driving wheels 204a and 204b. Note that by the use of DC-AC or the inverse conversion (AC-DC conversion) in the necessary portion, the power driving force conversion device 203 is applicable regardless of whether the device 203 is the AC motor or the DC motor. The various sensors 210 control the engine speed through the vehicle control device 209 or the opening of a throttle valve (throttle opening) that is not shown. The various sensors 210 may be a speed sensor, an acceleration sensor, an engine speed sensor.

The rotating force of the engine 201 is transmitted to the power generator 202, and by the rotating force, the power generated by the power generator 202 can be accumulated in the battery 208.

When the hybrid vehicle is decelerated by a control mechanism, which is not shown, the resistant force at the deceleration is added as the rotating force to the power driving force conversion device 203, and the regenerated power produced from the power driving force conversion device 203 by this rotating force is accumulated in the battery 208.

The battery 208 is connected to the power source outside the hybrid vehicle, whereby the power is supplied through the charging port 211 from the external power source and the received power can be accumulated in the battery 208.

Although not shown, an information processing device that processes information in regard to the vehicle control based on the information in regard to the secondary battery may be provided. As the information processing device, for example, an information processing device displaying the battery residual amount based on the battery residual amount is given.

As the function of the vehicle control device 209, for example, the function of the controller ICNT can be applied.

In the above example, the series hybrid car runs by the motor using the power generated by the power generator running on the engine or the power obtained by accumulating the aforementioned power in the battery once. However, the present technology is similarly applicable to the parallel hybrid car that runs on the output of the engine and the motor as a driving source while switching the three methods of the running on the engine only, the running on the motor only, and the running on the engine and motor. Furthermore, the present technology can be applied effectively to the so-called electric vehicle running by the drive of only the driving motor without the use of the engine.

5. Modified Example

The embodiment of the present technology has been described specifically; however, the present technology is not limited to the above embodiment and various modifications based on the technical thoughts of the present technology are possible.

In the above embodiment, the power storage system is configured by one string; however, the power storage system may be configured by a plurality of strings. For example, the plurality of strings may be connected in parallel to configure the power storage system.

In the case of using the string selected from among the strings, the control may be made to use the string so that the use history of the respective strings coincides with each other. For example, the total evaluation value may be calculated by the above method for each string and the string with the smaller total evaluation value may be used preferentially. In the case of using a plurality of strings under the temperature of lower than 0 degC., the string to be used is changed for every predetermined time, so that the strings may be used alternately.

The integral time coefficient and the like may be set in accordance with the material of the lithium ion secondary battery used in the power storage system. For example, in the case of using lithium cobaltate ($LiCoO_2$) as the positive electrode material capable of intercalating and deintercalating lithium (Li), the integral time under the high temperature (for example, 45 degC. or more) may be doubled or the integral time coefficient may be doubled.

As described above, in the normal charging and discharging region (for example, in the range of 10 degC. to 45 degC.), the charging current can be changed. For example, in the case where the charging current is changed from 1 C to 2 C, the integral time may be doubled (double speed) to provide the evaluation value.

A signal indicating the warning or indicating that the power storage system needs to be maintained may be notified to the portable terminal of the user.

It is preferable that the warning display or the like is performed as described in the above embodiment; however, the warning display or the like may be omitted and the operation of the power storage system may be stopped when the total evaluation value is greater than the threshold (for example, 10000 hours).

The charging current or the like in FIG. 5 and FIG. 7 may be changed to be inclined according to the temperature change. The charging current or the like may be changed exponentially.

Although the above embodiment has described the relatively large-scaled power storage system, the present technology is not limited thereto. The present technology is applicable to batteries used in cellular phones, smart phones, portable music players, tablet-type computers, laptop computers, or the like. Moreover, in addition to the above vehicles, the present technology can be applied to a mobile body such as aircraft, ships, and rockets. Such mobile bodies may be used under the environment that can widely vary; thus, the present technology can be used effectively.

The present technology can be achieved by not just the device but also a method, a program, a recording medium recording a program, a system or the like. The program can be provided to the user through the network or the portable memory such as an optical disk or a semiconductor memory.

Note that the structures and the processes in the embodiments and the modified example can be combined as appropriate to the extent that they do not contradict each other technically. The order of steps in the flow of the described process can be changed as appropriate to the extent that they do not contradict each other technically. The numerals, materials, and the like in the embodiments and the like are just examples and the present technology is not limited to those described above.

The present technology is applicable to a so-called cloud system in which the described process is dispersedly processed in a plurality of devices. The present technology can be achieved as the device in which at least a part of the process described in the embodiments and the like is performed in a system executing the described process.

The present technology can have any of the structures below.

(1) A power storage device including:
a power storage unit; and
an evaluation value acquisition unit that acquires an evaluation value in regard to use of the power storage unit, wherein the evaluation value acquisition unit is configured to acquire at least an evaluation value in a low-temperature region and an evaluation value in a high-temperature region among a plurality of regions set based on temperature.

(2) The power storage device according to (1), wherein the evaluation value acquisition unit is configured to acquire the evaluation value by using a weighting factor set for the region.

(3) The power storage device according to (2), wherein the evaluation value in the low-temperature region is obtained by multiplying by a predetermined weighting factor, the time obtained by integrating the charging time of the power storage unit.

(4) The power storage device according to (2) or (3), wherein the evaluation value in the high-temperature region is obtained by multiplying by a predetermined weighting factor, the time for which the power storage unit is used.

(5) The power storage device according to any of (2) to (4), wherein the evaluation value acquisition unit is configured to acquire the evaluation value by changing the weighting factor set for each of at least the low-temperature region and the high-temperature region when the value based on the evaluation value is greater than a predetermined threshold.

(6) The power storage device according to any of (1) to (5), including a control unit, wherein the control unit is configured to change a use condition of the power storage unit when the value based on the evaluation value is greater than the predetermined threshold.

(7) The power storage device according to (6), wherein the control unit is configured to compare the value based on the evaluation value and the threshold.

(8) The power storage device according to any of (1) to (7), including a communication unit that outputs the value based on the evaluation value to an external device.

(9) The power storage device according to any of (1) to (8), including a storage unit that stores the value based on the evaluation value.

(10) The power storage device according to any of (5) to (9), wherein the value based on the evaluation value is a value obtained by totaling the evaluation values.

(11) A control method including: acquiring an evaluation value in regard to use of a power storage unit by an evaluation value acquisition unit; and
acquiring at least an evaluation value in a low-temperature region and an evaluation value in a high-temperature region among a plurality of regions set based on temperature by the evaluation value acquisition unit.

(12) A control device including:
a communication unit that communicates with a power storage device; and an acquisition unit that acquires a value based on an evaluation value through the communication unit, wherein the value based on the evaluation value is a value based on an evaluation value including at least an evaluation value in a low-temperature region and an evaluation value in a high-temperature region among a plurality of regions set based on temperature.

(13) The control device according to (12), including a control unit, wherein the control unit is configured to compare the value based on the evaluation value and a threshold.

(14) The control device according to (13), wherein when the value based on the evaluation value is greater than a first threshold, the control unit outputs a signal for displaying warning, and when the value based on the evaluation value is greater than a second threshold, which is larger than the first threshold, the control unit outputs a signal for stopping a system including the power storage device.

(15) The control device according to (12), including a control unit, wherein when the value based on the evaluation value is greater than the threshold, the control unit transmits a predetermined signal to an external device through a network.

(16) A power storage system including:
a plurality of power storage devices; and
a control device connected to the plurality of power storage devices, wherein
the power storage device includes,
a power storage unit, and
an evaluation value acquisition unit that acquires an evaluation value in regard to use of the power storage unit, the evaluation value acquisition unit is configured to acquire at least an evaluation value in a low-temperature region and an evaluation value in a high-temperature region among a plurality of regions set based on temperature, and the control device includes
a communication unit that communicates with the power storage device, and an acquisition unit that acquires through the communication unit, a value based on an evaluation value including the evaluation value in the low-temperature region and the evaluation value in the high-temperature region from one power storage device or a plurality of power storage devices selected in accordance with temperature distribution from among the plurality of power storage devices.

(17) A maintenance system including:
a first device; and
a second device, wherein
the first device includes
a first communication unit that communicates with a power storage device,
a second communication unit that communicates with the second device,
an acquisition unit that acquires a value based on an evaluation value in regard to use of the power storage device, and
a control unit that, when the value based on the evaluation value is greater than a predetermined threshold, executes control for transmitting a predetermined signal to the second device using the second communication unit, wherein
the value based on the evaluation value is a value based on an evaluation value including at least an evaluation value in a low-temperature region and an evaluation value in a high-temperature region among a plurality of regions set based on temperature, and
the second device includes a reception unit that receives the predetermined signal transmitted from the first device.

(18) The maintenance system according to (17), wherein the second device includes a control unit that executes a process in regard to maintenance of a system including the power storage device upon the reception of the predetermined signal.

(19) An electric vehicle including:
a power storage unit; and
an evaluation value acquisition unit that acquires an evaluation value in regard to use of the power storage unit, wherein
the evaluation value acquisition unit includes a power storage device configured to acquire at least an evaluation value in a low-temperature region and an evaluation value in a high-temperature region among a plurality of regions set based on temperature.

(20) An electronic equipment including:
a power storage unit; and
an evaluation value acquisition unit that acquires an evaluation value in regard to use of the power storage unit, wherein
the evaluation value acquisition unit includes a power storage device configured to acquire at least an evaluation value in a low-temperature region and an evaluation value in a high-temperature region among a plurality of regions set based on temperature.

(21) A storage device, comprising:
a storage unit; and
an evaluation value acquisition unit, wherein
the evaluation value acquisition unit is configured to acquire an evaluation value including at least a first evaluation value corresponding to the storage unit in a low-temperature region and a second evaluation value corresponding to the storage unit in a high-temperature region.

(22) The storage device according to (21), further comprising a control unit, wherein the control unit is configured to control a condition of the storage unit by comparing a value based on at least the first evaluation value and the second evaluation value with a predetermined threshold.

(23) The storage device according to (21), wherein the first evaluation value is obtained by multiplying by a predetermined weighting factor, time obtained by integrating at least one of a charging time and a discharging time of the storage unit.

(24) The storage device according to (21), wherein the second evaluation value is obtained by multiplying by a predetermined weighting factor, time obtained by integrating at least one of a charging time and a discharging time of the storage unit.

(25) The storage device according to (21), wherein the evaluation value acquisition unit is configured to acquire the evaluation value by changing a weighting factor set for at least the low-temperature region and the high-temperature region when a value based on the evaluation value is greater or smaller than a predetermined threshold.

(26) The storage device according to any of (21) to (25), comprising a communication unit configured to output a value based on the evaluation value to an external device.

(27) The storage device according to any of (21) to (26), comprising the storage unit configured to store a value based on the evaluation value.

(28) The storage device according to (26), wherein the value based on the evaluation value is a sum of at least the first evaluation value and the second evaluation value.

(29) The storage device according to any of (21) to (28), wherein the low-temperature region is less than 0 degC. and the high-temperature region is 45 degC. or more.

(30) A control device, comprising:
a communication unit configured to communicate with a storage unit; and
a control unit,
wherein the control unit is configured to control a condition of the storage unit by comparing a value based on at least a first evaluation value in a low-temperature region and a second evaluation value in a high-temperature with a predetermined threshold.

(31) The control device according to (30), further comprising an evaluation value acquisition unit, wherein the evaluation value acquisition unit is configured to acquire an evaluation value including at least a first evaluation value corresponding to the storage unit in a low-temperature region and a second evaluation value corresponding to the storage unit in a high-temperature region.

(32) The control device according to (31), wherein when the value is greater than a first threshold, the control unit is configured to output a signal for displaying warning, and when the value is greater than a second threshold, which is larger than the first threshold, the control unit is configured to output a signal for stopping a system including the storage device.

(33) The control device according to any of (30) to (31), comprising the control unit, wherein when the value is greater or smaller than the threshold, the control unit is configured to transmit a predetermined signal to an external device through a network.

(34) A power storage system comprising the storage device according to (21), wherein the storage system includes a control device, the control device including a communication unit configured to communicate with the storage device and through which a value based on the evaluation value is provided.

(35) A maintenance system comprising:
a first device; and
a second device, wherein
the first device includes
a first communication unit configured to communicate with a storage device,
a second communication unit configured to communicate with the second device,
an evaluation value acquisition unit configured to acquire an evaluation value, and
a control unit is configured to, when the evaluation value is greater than a predetermined threshold, control for transmitting a predetermined signal to the second device using the second communication unit,
wherein the evaluation value including at least a first evaluation value corresponding to the storage device in a low-temperature region and a second evaluation value corresponding to the storage device in a high-temperature region, and
the second device includes a reception unit configured to receive the predetermined signal transmitted from the first device.

(36) The maintenance system according to (35), wherein the second device includes a control unit configured to execute a process in regard to maintenance of a system including the storage device upon the reception of the predetermined signal.

(37) An electric vehicle comprising the storage device according to any of (21) to (29).

(38) An electronic equipment comprising the storage device according to any of (21) to (29).

REFERENCE SIGNS LIST 1, 2 Power storage system
7 Control unit
15 Temperature detector
23 Memory
30 Control unit
31 First communication unit
32 Second communication unit
40 Maintenance system
50 Maintenance device
MOD Power storage module
CTN1 Module controller
COM1 Communication unit
ICNT Controller
NTW Network

The invention claimed is:
1. A storage device, comprising:
a storage unit; and
an evaluation value acquisition unit, wherein
the evaluation value acquisition unit is configured to acquire an evaluation value including at least a first evaluation value corresponding to the storage unit in a low-temperature region and a second evaluation value corresponding to the storage unit in a high-temperature region,
wherein the first evaluation value is obtained by multiplying by a first weighting factor and the second evaluation value is obtained by multiplying by a second weighting factor, and
wherein the first weighting factor and the second weighting factor are larger than a weighting factor in a temperature region between the low-temperature region and the high-temperature region to control charging and discharging based on determined temperature changes of the storage unit.

2. The storage device according to claim 1, further comprising a control unit, wherein the control unit is configured to control a condition of the storage unit by comparing a value based on at least the first evaluation value and the second evaluation value with a predetermined threshold.

3. The storage device according to claim 1, wherein the first weighting factor includes a first integral time coefficient.

4. The storage device according to claim 1, wherein the second weighting factor includes a second integral time coefficient.

5. The storage device according to claim 1, wherein the evaluation value acquisition unit is configured to acquire the evaluation value by changing at least one of the first and second weighting factors set for at least the low-temperature region and the high-temperature region when a value based on the evaluation value is greater or smaller than a predetermined threshold.

6. The storage device according to claim 1, comprising a communication unit configured to output a value based on the evaluation value to an external device.

7. The storage device according to claim 1, comprising a storage unit configured to store a value based on the evaluation value.

8. The storage device according to claim 6, wherein the value based on the evaluation value is a sum of at least the first evaluation value and the second evaluation value.

9. The storage device according to claim 1, wherein the low-temperature region is less than 0 degC. and the high-temperature region is 45 degC. or more.

10. A control device, comprising:
a communication unit configured to communicate with a storage unit;
and
a control unit,
wherein the control unit is configured to control a condition of the storage unit by comparing a value based on at least a first evaluation value in a low-temperature region and a second evaluation value in a high-temperature with a predetermined threshold,
wherein the first evaluation value is obtained by multiplying by a first weighting factor and the second evaluation value is obtained by multiplying, by a second weighting factor, and
wherein the first weighting factor and the second weighting factor are larger than a weighting factor in a temperature region between the low-temperature region and the high-temperature region to control charging and discharging based on determined temperature changes of the storage unit.

11. The control device according to claim 10, further comprising an evaluation value acquisition unit, wherein the evaluation value acquisition unit is configured to acquire an evaluation value including at least the first evaluation value corresponding to the storage unit in the low-temperature region and the second evaluation value corresponding to the storage unit in the high-temperature region.

12. The control device according to claim 11, wherein when the value is greater than a first threshold, the control unit is configured to output a signal for displaying warning, and when the value is greater than a second threshold, which is larger than the first threshold, the control unit is configured to output a signal for stopping a system including the storage device.

13. The control device according to claim 11, comprising a control unit, wherein when the value is greater or smaller than the threshold, the control unit is configured to transmit a predetermined signal to an external device through a network.

14. A power storage system comprising the storage device according to claim 1, wherein the storage system includes a control device, the control device including a communication unit configured to communicate with the storage device and through which a value based on the evaluation value is provided.

15. An electric vehicle comprising the storage device according to claim 1.

16. An electronic equipment comprising the storage device according to claim 1.

* * * * *